US007206897B2

(12) United States Patent
Perego et al.

(10) Patent No.: US 7,206,897 B2
(45) Date of Patent: *Apr. 17, 2007

(54) MEMORY MODULE HAVING AN INTEGRATED CIRCUIT BUFFER DEVICE

(75) Inventors: Richard E. Perego, San Jose, CA (US); Stefanos Sidiropoulos, Palo Alto, CA (US); Ely Tsern, Los Altos, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/128,904

(22) Filed: May 13, 2005

(65) Prior Publication Data

US 2005/0210196 A1    Sep. 22, 2005

Related U.S. Application Data

(63) Continuation of application No. 11/078,244, filed on Mar. 11, 2005, now Pat. No. 7,003,618, which is a continuation of application No. 11/054,797, filed on Feb. 10, 2005, now Pat. No. 7,000,062, which is a continuation of application No. 10/952,667, filed on Sep. 28, 2004, which is a continuation of application No. 10/625,276, filed on Jul. 23, 2003, which is a continuation of application No. 10/272,024, filed on Oct. 15, 2002, which is a continuation of application No. 09/479,375, filed on Jan. 5, 2000, now Pat. No. 6,502,161.

(51) Int. Cl.
*G06F 12/00* (2006.01)

(52) U.S. Cl. .................................. 711/105; 711/115
(58) Field of Classification Search ............... None
See application file for complete search history.

(56) References Cited

U.S. PATENT DOCUMENTS 4,621,339 A    11/1986 Wagner et al.
(Continued)

FOREIGN PATENT DOCUMENTS

EP    0 198 429    10/1986
(Continued)

OTHER PUBLICATIONS

*Intel Developer Forum, "DDR2 Memory In 2004 Servers—Recipes For Successful Designs", Sep. 2003.
(Continued)

*Primary Examiner*—Kevin Verbrugge
(74) *Attorney, Agent, or Firm*—Vierra Magen Marcus & DeNiro LLP

(57) ABSTRACT

A memory module includes an integrated circuit buffer device that receives control information via a connector interface. A first plurality of signal lines carries a first address from the integrated circuit buffer device to a first memory device. A second plurality of signal lines carries a first control signal from the integrated circuit buffer device to the first memory device. The first control signal specifies a read operation by the first memory device such that the first memory device provides first data, accessed from a memory location in the first memory device based on the first address, to the integrated circuit buffer device. A first signal line carries a first signal from the integrated circuit buffer device to the first memory device. The first signal synchronizes communication of the first control signal from the integrated circuit buffer device to the first memory device. A third plurality of signal lines carries a second address from the integrated circuit device to the second memory device. A fourth plurality of signal lines carries a second control signal from the integrated circuit buffer device to the second memory device. The second control signal specifies a read operation. The second control signal corresponds to the control information. A second signal line carries a second signal from the integrated circuit buffer device to the second memory device. The second signal synchronizes communication of the second control signal from the integrated circuit buffer device to the second memory device. A transmitter circuit is disposed on the integrated circuit buffer device.

32 Claims, 11 Drawing Sheets

U.S. PATENT DOCUMENTS

| | | | |
|---|---|---|---|
| 4,631,666 A | 12/1986 | Harris et al. | |
| 4,644,532 A | 2/1987 | George et al. | |
| 4,667,305 A | 5/1987 | Dill et al. | |
| 4,747,070 A | 5/1988 | Trottier et al. | |
| 4,747,100 A | 5/1988 | Roach et al. | |
| 4,858,107 A | 8/1989 | Fedele | |
| 4,864,563 A | 9/1989 | Pavey et al. | |
| 4,947,257 A * | 8/1990 | Fernandez et al. | 348/585 |
| 4,977,498 A | 12/1990 | Rastegar et al. | |
| 5,034,917 A | 7/1991 | Bland et al. | |
| 5,068,650 A * | 11/1991 | Fernandez et al. | 345/547 |
| 5,228,132 A * | 7/1993 | Neal et al. | 711/5 |
| 5,228,134 A | 7/1993 | MacWilliams et al. | |
| 5,283,877 A | 2/1994 | Gastinel et al. | |
| 5,325,493 A | 6/1994 | Herrell et al. | |
| 5,355,467 A | 10/1994 | MacWilliams et al. | |
| 5,371,880 A | 12/1994 | Bhattacharya | |
| 5,400,360 A | 3/1995 | Richards et al. | |
| 5,408,646 A | 4/1995 | Olnowich et al. | |
| 5,475,818 A | 12/1995 | Molyneaux et al. | |
| 5,511,224 A | 4/1996 | Tran et al. | |
| 5,513,135 A * | 4/1996 | Dell et al. | 365/52 |
| 5,513,377 A | 4/1996 | Capowski et al. | |
| 5,537,394 A | 7/1996 | Abe et al. | |
| 5,544,342 A | 8/1996 | Dean | |
| 5,553,266 A | 9/1996 | Metzger et al. | |
| 5,557,266 A | 9/1996 | Calvignac et al. | |
| 5,574,945 A | 11/1996 | Elko et al. | |
| 5,602,780 A | 2/1997 | Diem et al. | |
| 5,604,735 A | 2/1997 | Levinson et al. | |
| 5,630,095 A | 5/1997 | Snyder | |
| 5,642,444 A | 6/1997 | Mostafavi | |
| 5,655,113 A | 8/1997 | Leung et al. | |
| 5,659,710 A | 8/1997 | Sherman et al. | |
| 5,701,313 A * | 12/1997 | Purdham | 714/764 |
| 5,742,840 A | 4/1998 | Hansen et al. | |
| 5,748,872 A | 5/1998 | Norman | |
| 5,787,083 A | 7/1998 | Iwamoto et al. | |
| 5,802,054 A | 9/1998 | Bellenger | |
| 5,802,565 A | 9/1998 | McBride | |
| 5,805,798 A | 9/1998 | Kearns et al. | |
| 5,838,985 A | 11/1998 | Ohki | |
| 5,848,145 A | 12/1998 | Gallagher et al. | |
| 5,860,080 A | 1/1999 | James et al. | |
| 5,867,180 A | 2/1999 | Katayama et al. | |
| 5,867,422 A | 2/1999 | John | |
| 5,883,839 A | 3/1999 | Tosaka et al. | |
| 5,884,036 A | 3/1999 | Haley | |
| 5,893,921 A | 4/1999 | Bucher et al. | |
| 5,898,863 A | 4/1999 | Ofer et al. | |
| 5,900,017 A | 5/1999 | Genduso et al. | |
| 5,901,294 A | 5/1999 | Tran et al. | |
| 5,911,052 A | 6/1999 | Singhal et al. | |
| 5,913,044 A | 6/1999 | Tran et al. | |
| 5,917,760 A | 6/1999 | Millar | |
| 5,923,893 A | 7/1999 | Moyer et al. | |
| 5,926,839 A | 7/1999 | Katayama | |
| 5,953,215 A | 9/1999 | Karabatsos | |
| 5,982,238 A | 11/1999 | Soderquist | |
| 6,006,318 A | 12/1999 | Hansen et al. | |
| 6,016,282 A | 1/2000 | Keeth | |
| 6,034,878 A | 3/2000 | Osaka et al. | |
| 6,038,682 A | 3/2000 | Norman | |
| 6,065,092 A | 5/2000 | Roy | |
| 6,092,229 A | 7/2000 | Boyle et al. | |
| 6,104,417 A | 8/2000 | Nielsen et al. | |
| 6,108,731 A * | 8/2000 | Suzuki et al. | 710/301 |
| 6,125,419 A | 9/2000 | Umemura et al. | |
| 6,142,830 A | 11/2000 | Looeffler | |
| 6,151,648 A | 11/2000 | Haq | |
| 6,154,826 A | 11/2000 | Wulf et al. | |
| 6,154,855 A | 11/2000 | Norman | |
| 6,160,423 A | 12/2000 | Haq | |
| 6,185,644 B1 | 2/2001 | Farmwald et al. | |
| 6,185,654 B1 * | 2/2001 | Van Doren | 711/5 |
| 6,208,273 B1 | 3/2001 | Dye et al. | |
| 6,247,100 B1 | 6/2001 | Drehmel et al. | |
| 6,255,859 B1 | 7/2001 | Haq | |
| 6,263,413 B1 | 7/2001 | Motomura et al. | |
| 6,266,252 B1 | 7/2001 | Karabatsos | |
| 6,272,609 B1 | 8/2001 | Jeddeloh | |
| 6,276,844 B1 | 8/2001 | Coteus et al. | |
| 6,292,877 B1 | 9/2001 | Ryan | |
| 6,317,352 B1 | 11/2001 | Halbert et al. | |
| 6,327,205 B1 | 12/2001 | Haq | |
| 6,330,687 B1 | 12/2001 | Griffith | |
| 6,345,321 B1 | 2/2002 | Litaize et al. | |
| 6,349,051 B1 * | 2/2002 | Klein | 365/63 |
| 6,369,605 B1 | 4/2002 | Bonella et al. | |
| 6,408,402 B1 | 6/2002 | Norman | |
| 6,414,904 B2 | 7/2002 | So et al. | |
| 6,425,064 B2 | 7/2002 | Soderquist | |
| 6,434,035 B2 | 8/2002 | Miersch et al. | |
| 6,446,158 B1 | 9/2002 | Karabatsos | |
| 6,449,213 B1 | 9/2002 | Dodd et al. | |
| 6,449,679 B2 | 9/2002 | Ryan et al. | |
| 6,449,703 B2 | 9/2002 | Jeddeloh | |
| 6,449,727 B1 | 9/2002 | Toda | |
| 6,477,592 B1 * | 11/2002 | Chen et al. | 710/52 |
| 6,477,614 B1 | 11/2002 | Leddige et al. | |
| 6,480,927 B1 | 11/2002 | Bauman | |
| 6,487,102 B1 | 11/2002 | Halbert et al. | |
| 6,493,250 B2 | 12/2002 | Halbert et al. | |
| 6,502,161 B1 | 12/2002 | Perego et al. | |
| 6,510,503 B2 | 1/2003 | Gillingham et al. | |
| 6,513,080 B1 | 1/2003 | Haq | |
| 6,513,091 B1 | 1/2003 | Blackmon et al. | |
| 6,526,469 B1 | 2/2003 | Drehmel et al. | |
| 6,530,006 B1 | 3/2003 | Dodd et al. | |
| 6,530,033 B1 * | 3/2003 | Raynham et al. | 714/5 |
| 6,557,069 B1 | 4/2003 | Drehmel et al. | |
| 6,587,912 B2 | 7/2003 | Leddige et al. | |
| 6,604,180 B2 | 8/2003 | Jeddeloh | |
| 6,622,224 B1 | 9/2003 | Cloud | |
| 6,625,687 B1 | 9/2003 | Halbert et al. | |
| 6,633,947 B1 | 10/2003 | Holman et al. | |
| 6,643,752 B1 | 11/2003 | Donnelly et al. | |
| 6,690,726 B1 | 2/2004 | Yavits et al. | |
| 6,708,248 B1 | 3/2004 | Garrett, Jr. et al. | |
| 6,889,284 B1 | 5/2005 | Nizar et al. | |
| 6,968,419 B1 | 11/2005 | Holman | |
| 6,970,968 B1 | 11/2005 | Holman | |
| 7,007,130 B1 | 2/2006 | Holman | |
| 2001/0039606 A1 | 11/2001 | Jeddeloh | |
| 2002/0083287 A1 | 6/2002 | Zumkehr et al. | |
| 2002/0112119 A1 | 8/2002 | Halbert et al. | |
| 2002/0124153 A1 | 9/2002 | Litaize et al. | |
| 2002/0184462 A1 | 12/2002 | Jeddeloh | |
| 2003/0018880 A1 | 1/2003 | Litaize et al. | |
| 2003/0120895 A1 | 6/2003 | Litaize et al. | |
| 2003/0177313 A1 | 9/2003 | Iyer et al. | |
| 2004/0015650 A1 | 1/2004 | Zumkehr et al. | |
| 2004/0095838 A1 | 5/2004 | Li | |
| 2004/0150024 A1 | 8/2004 | Mazoyer et al. | |
| 2004/0246767 A1 | 12/2004 | Vogt | |
| 2004/0246785 A1 | 12/2004 | Vogt | |
| 2004/0246786 A1 | 12/2004 | Vogt | |
| 2004/0250024 A1 * | 12/2004 | Vogt | 711/131 |
| 2004/0250153 A1 | 12/2004 | Vogt | |
| 2004/0250181 A1 | 12/2004 | Vogt et al. | |

2004/0260991 A1 12/2004 Vogt et al.

FOREIGN PATENT DOCUMENTS

| EP | 0 282 070 B1 | 8/1994 |
|---|---|---|
| EP | 0 811 916 A2 | 12/1997 |
| EP | 1069509 A2 | 1/2001 |
| EP | 05001769 | 5/2006 |
| WO | WO 99/30240 | 6/1999 |
| WO | WO 99/41666 | 8/1999 |
| WO | WO 99/41667 | 8/1999 |
| WO | 2004/111856 | 12/2004 |

OTHER PUBLICATIONS

*QBM Alliance, Platform Conference, Quad Band Memory (QBM tm): DDR 200/266/333 devices producing DDR400/533/667, Jan. 23-24, 2002.
*Karabatsos, C., "Quad Band Memory (QBM) Technology", Kentron Technologies, Inc., Apr. 2001.
*Quad Band Memory (QBM), "The 'QBM Enabled' VIA PT880/PM880 Chipset with the Fastest Memory".
*Weber, F., "The AMD Athlon Processor: Future Directions", AMD.
*"Intel 82804AA Memory Repeater Hub for SDRAM (MRH-S) Datasheet", Intel Corp., pp. 2-48 (Nov. 1999).
*"Intel 82805AA Memory Translator Hub (MTH) Datasheet", Intel Corp., pp. 1-48 (Nov. 1999).
*Cataldo, A., "TI Fields DSP-Based Media Processor on a DIMM", EE Times (Jan. 2000).
*Mac Williams, P., "PC Memory Directions For 1999 and Beyond", Intel Developer Forum, pp. 1-10 (Sep. 1998).
*Johnson, B., "Direct RDRAM Basic Architecture and Program Overview", Intel Developer Forum, pp. 1-14 (Sep. 1998).
*Gillingham, P., "SLDRAM Architectural and Functional Overview", SLDRAM Consortium, SLDRAM Inc., pp. 1-14 (Aug. 1997).
*"Draft Standard for a High-Speed Memory Interface (Synclink)", Draft 0.99 IEEE P1596.7-199X, IEEE Inc., pp. 1-51 (1996).
*Wiggers, H., "SyncLink A Proposal for an Implementation of IEEE P1596.4", Hewlett Packard, pp. 1-20 (Mar. 1995).
*"KMM377S1620CT2 SDRAM Module Datasheet", Samsung Electronics Inc., pp. 1-2 (Nov. 1998).
*"SLD4M18DR400 4MEGx18 SLDRAM Datasheet", SLDRAM Inc., pp. 1-69 (Jul. 1998).
*Poulton, J., "Signaling in High Performance Memory Systems", IEEE Solid State Circuits Conference, slides 1-59 (Feb. 1999).
*"SLDRAM 400Mb/s/pin Command/Address Repeater", SLD10400 Rev .5, SLDRAM Consortium, pp. 1-12 (Jan. 7, 1998).
*Minutes of meeting No. 75 JEDEC JC-42.3 Committee on RAM Memories, and referenced attachment "Y" of the presentation titled "SyncLink", May 24, 1995, New Orleans.
*Intel Developer Forum, "Fully Buffered DIMM (FB-DIMM) Server Memory Architecture: Capacity, Performance, Reliability, and Longevity", Feb. 18, 2004.
*Intel Developer Forum, "Fully Buffered DIMM (FB-DIMM) Design Considerations", Feb. 18, 2004.
*IEEE Standard for Scalable Coherent Interface (SCI), "Microprocessor and Microcomputer Standards Subcommittee of the IEEE Computer Society", IEEE Std 1596-1992.
*SCI, "P1596: SCI, A Scalable Coherent Interface", Nov. 28, 1988.
*Gustavson et al., DRAFT "The Scalable Coherent Interface Project (SuperBus)", SCI, Aug. 22, 1988, Rev. 14.
*Schanke, "Proposal for Clock Distribution in SCI", SCI, May 5, 1989.
*James, "Scalable I/O Architecture for Buses", COMPCON Spring 1989, SCI, Nov. 28, 1988.
*Volz et al., "Position Paper On Global Clock For the Futurebus +", SCI, 1989.
*Kristiansen et al., "Scalable Coherent Interface", to appear in Eurobus Conference Proceedings, May 1989.
*Gustavson et al., "Macintosh HD:Desktop Folder:SLDRAMrepeaterConcerns", Sunday, Nov. 23, 1997, 4 pages.

*Jeddeloh, Joe, "Fully Buffered DIMM (FB-DIMM)", Advanced Systems Technology, Micron Technology, Inc. Apr. 15-16, 2004.
*PCT International Search Report (Jun. 27, 2001) 4 pages.
*U.S. Appl. No. 10/713,868, filed Nov. 14, 2003 by Pete D. Vogt.
*U.S. Appl. No. 10/714,025, filed Nov. 14, 2003 by Pete D. Vogt.
*U.S. Appl. No. 10/714,026, filed Nov. 14, 2003 by Pete D. Vogt.
*U.S. Appl. No. 10/883,474, filed Jun. 30, 2004 by Pete D. Vogt.
*U.S. Appl. No. 10/882,999, filed Jun. 30, 2004 by Pete D. Vogt.
*U.S. Appl. No. 10/859,438, filed May 31, 2004 by Pete D. Vogt.
*U.S. Appl. No. 10/858,850, filed May 31, 2004 by Pete D. Vogt.
*U.S. Appl. No. 10/859,060, filed May 31, 2004 by Pete D. Vogt.
*Ng, R. (Sun Microsystems Inc.). "Fast computer memories", IEEE Spectum, Oct. 1992, pp. 36-39.
*Salters, R.H.W. (Philips Research Laboratories), "Fast DRAMS for sharper TV", IEEE Spectrum, Oct. 1992, pp. 40-42.
*Jones, F (United Memories, Inc.), "A new era of fast dynamic RAMs", IEEE Spectrum, Oct. 1992, pp. 43-49.
*Farmwald, M. et al. (Rambus Inc.), "A fast path to one memory", IEEE Spectrum, Oct. 1992, pp. 50-51.
*Gjessing, S. (University of Oslo), Gustavson, D.B (Stanford Linear Accelerator Center), James, D. et al. (Apple Computer Inc.), Wigger, H. (Hewlett-Packard Co.), "A RAM link for high speed", IEEE Spectrum, Oct. 1992, pp. 52-53.
*The Institute of Electrical and Electronics Engineering, Inc., "IEEE Standard for High-Bandwidth Memory Interface Based on Scalable Coherent Interface (SCI) Signaling Technology (RamLink)", 1996, pp. 1-91.
*Microsoft Press Computer Dictionary, 3rd Ed., 1997, pp. 48-68.
"Intel 82804AA Memory Repeater Hub for SDRAM (MRH-S) Datasheet", Intel Corp., pp. 2-48, (Nov. 1999).
"Intel 82805AA Memory Translator Hub (MTH) Datasheet", Intel Corp., pp. 1-48, (Nov. 99).
A. Cataldo "TI fields DSP-Based Media Processor on a DIMM", EE Times (Jan. 2000).
P. Mac Williams, "PC Memory Directions For 1999 and Beyond", Intel Developer Forum, pp. 1-10, (Sep. 1998).
B Johnson, "Direct RDRAM Basic Architecture and Program Overview", Intel Developer Forum, pp. 1-14, (Sep. 1998).
P. Gillingham, "SLDRAM Architectural and Functional Overview", SLDRAM Consortium, SLDRAM Inc., pp. 1-14, (Aug. 1997).
"Draft Standard For a High-Speed Memory Interface (Synclink)", Draft 0.99 IEEE P1596.7-199X, IEEE Inc. (1996), pp. 1-51.
H. Wiggers, "SyncLink A Proposal for an Implementation of IEEE P1596.4", Hewlett Packard, Mar. 1995, pp. 1-20.
"KMM377S16120CT2 SDRAM Module Datasheet", Samsung Electronics Inc., pp. 1-2, (Nov. 98).
"SLD4M18DR400 4MEGx18 SLDRAM Datasheet", SLDRAM Inc., pp. 1-69, (Jul. 98).
J. Poulton, "Signaling in High Performance Memory Systems", IEEE Solid State Circuits Conference, slides 1-59, (Feb. 1999).
"SLDRAM 400Mb/s/pin Command/Address Repeater", SLD10400 Rev .5, SLDRAM Consortium, pp. 1-12 (Jan. 7, 1998).
Minutes of meeting No. 75 JEDEC JC-42.3 Committee on RAM Memories, and referenced attachment "Y" of the presentation titled "SyncLink", May 24, 1995, New Orleans.
Intel Developer Forum, "DDR2 Memory In 2004 Servers—Recipes For Successful Designs", Sep. 2003.
QBM Alliance, Platform Conference, Quad Band Memory (QBM tm): DDR 200/266/333 devices producing DDR400/533/667, Jan. 23-24, 2002.
Karabatsos, C., "Quad Band Memory (QBM) Technology", Kenton Technologies, Inc., Apr. 2001.
Quad Band Memory (QBM), "The 'QBM Enabled' VIA PT880/PM880 Chipset Solutions with the Fastest Memory".
Weber, F., "The AMD Athlon Processor: Future Directions", AMD.
Intel Developer Forum, "Fully Buffered DIMM (FB-DIMM) Server Memory Architecture: Capacity, Performance, Reliability, and Longevity", Feb. 18, 2004.
Intel Developer Forum, "Fully Buffered DIMM (FB-DIMM) Design Considerations", Feb. 18, 2004.
Joe Jeddeloh, "Fully Buffered DIMM (FB-DIMM)", Advanced Systems Technology, Micron Technology, Inc., Conference Apr. 15-16, 2004.

PCT International Search Report (Jun. 27, 2001) 4 pages.

Microsoft Press Computer Dictionary, 3rd Ed., 1997, pp. 48 and 68.

Gustavson et al., "Macintosh HD:Desktop Folder:SLDRAM-repeaterConcerns", Sunday, Nov. 23, 1997, 4 pages.

IEEE Standard for Scalable Coherent Interface (SCI), "Microprocessor and Microcomputer Standards Subcommittee of the IEEE Computer Society", IEEE Std 1596-1992.

SCI, "P1596: SCI, A Scalable Coherant Interface", Nov. 29, 1988.

Gustavson et al., DRAFT "The Scalable Coherent Interface Project (SuperBus)", SCI, Aug. 22, 1988, Rev. 14.

Schanke, "Proposal for Clock Distribution in SCI", SCI, May 5, 1989.

James, "Scalable I/O Architecture for Buses", COMPCON Spring 1989, SCI, Nov. 28, 1988.

Volz et al., "Position Paper On Global Clock For the Futurebus+", SCI, 1989.

Kristiansen et al., "Scalable Coherent Interface", to appear in Eurobus Conference Proceedings, May 1989.

Jones, F (United Memories, Inc.), "A new era of fast dynamic RAMs", IEEE Spectrum, Oct. 1992, pp. 43-49.

Farmwald, M. et al. (Rambus Inc.), "A fast path to one memory", IEEE Spectrum, Oct. 1992, pp. 50-51.

Gjessing, S. (University of Oslo), Gustavson, D.B (Stanford Linear Accelerator Center), James, D. et al. (Apple Computer Inc.), Wigger, H. (Hewlett-Packard Co.), "RAM link for high speed", IEEE Spectrum, Oct. 1992, pp. 52-53.

The Institute of Electrical and Electronics Engineering, Inc., "IEEE Standard for High-Bandwidth Memory Interface Based on Scalable Coherent Interface (SCI) Signaling Technology (RamLink)", 1996, pp. 1-91.

Lizy Kurian John, "VaWiRAM: A Variable Width Random Access Memory Module", 9th International Conference on VLSI Design, Jan. 1996, pp. 219-224, 1995 IEEE.

Request for Declaration of Interference, filed on Apr. 13, 2006 in U.S. Appl. No. 11/203,652 to Drehmel et al., including exhibits A through K.

Jerry D. Gilson, Editor-in-Chief, "The Mobile Communications Handbook," copyright 1996 CRC Press, Inc., p. 24.

G. Doettling et al., "S/309 Parallel Enterprise Server Generation 3: A Balanced System and Cache Structure," IBM J. Res. Develop., vol. 41 (No. 4/5), Jul./Sep. 1997, pp. 405-428.

International Search Report in PCT/US05/17066, mailed Nov. 2, 2005.

JEDEC Standard - "FBDIMM Specification: High Speed Differential PTP Link at 1.5V," JESDS-18, Sep. 2006, available at "http://www.jedec.org/download/search/JESD8-18.pdf".

Excel Spreadsheet, entitled "Patents.xls," available at "http://www.jedec.org/download/search/FBDIMM/patents.xls".

Lizy Kurian John, "VaWiRAM: A Variable Width Random Access Memory Module," 9th International Conference on VLSI Design, Jan. 1996, pp. 219-224, 1995 IEEE.

"Patentica" letter, dated Dec. 18, 2004, 4 pages, referenced in Excel Spreadsheet, entitled "Patents.xls".

"Kentron" letter, dated Jan. 23, 2006, 1 page, referenced in Excel Spreadsheet, entitled "Patents.xls".

"Wintec" letter, dated Mar. 19, 2003, 1 page, referenced in Excel Spreadsheet, entitled "Patents.xls".

"Wintec" letter, dated Apr. 2, 2003, 1 page, referenced in Excel Spreadsheet, entitled "Patents.xls".

"AMD" letter, dated Apr. 12, 2004, 1 page, referenced in Excel Spreadsheet, entitled "Patents.xls".

"Micron" letter, dated Dec. 2, 2003, 3 pages, referenced in Excel Spreadsheet, entitled "Patents.xls".

"Micron" letter, dated Sep. 16, 2005, 1 page, referenced in Excel Spreadsheet, entitled "Patents.xls".

"Inphi" letter, dated Mar. 3, 2005, 1 page, referenced in Excel Spreadsheet, entitled "Patents.xls".

"Inphi" letter, dated Jun. 6, 2005, 1 page, referenced in Excel Spreadsheet. entitled "Patents.xls.".

"Samsung" letter, dated Oct. 25, 2004, 1 page, referenced in Excel Spreadsheet, entitled "Patents.xls".

* cited by examiner

MEMORY MODULE HAVING AN INTEGRATED CIRCUIT BUFFER DEVICE

This is a continuation of U.S. patent application Ser. No. 11/078,244 filed on Mar. 11, 2005 now U.S. Pat. No. 7,003,618, which is a continuation of U.S. patent application Ser. No. 11/054,797 filed on Feb. 10, 2005 now U.S. Pat. No. 7,000,062, which is a continuation of U.S. patent application Ser. No. 10/952,667 filed on Sep. 28, 2004, which is a continuation of U.S. patent application Ser. No. 10/625,276 filed on Jul. 23, 2003 (allowed), which is a continuation of U.S. patent application Ser. No. 10/272,024 filed on Oct. 15, 2002 (allowed), which is a continuation of application Ser. No. 09/479,375 filed on Jan. 5, 2000 (now U.S. Pat. No. 6,502,161).

BACKGROUND OF THE INVENTION

This invention relates to memory systems, memory subsystems, memory modules or a system having memory devices. More specifically, this invention is directed toward memory system architectures which may include integrated circuit devices such as one or more controllers and a plurality of memory devices.

Some contemporary memory system architectures may demonstrate tradeoffs between cost, performance and the ability to upgrade, for example; the total memory capacity of the system. Memory capacity is commonly upgraded via memory modules or cards featuring a connector/socket interface. Often these memory modules are connected to a bus disposed on a backplane to utilize system resources efficiently. System resources include integrated circuit die area, package pins, signal line traces, connectors, backplane board area, just to name a few. In addition to upgradeability, many of these contemporary memory Systems also require high throughput for bandwidth intensive applications, such as graphics.

With reference to FIG. 1, a representational block diagram of a conventional memory system employing memory modules is illustrated. Memory system 100 includes memory controller 110 and modules 120a–120c. Memory controller 110 is coupled to modules 120a–120c via control/address bus 130, data bus 140, and corresponding module control lines 150a–150c. Control/address bus 130 typically comprises a plurality of address lines and control signals (e.g., RAS, CAS and WE).

The address lines and control signals of control/address bus 130 are bussed and "shared" between each of modules 120a–120c to provide row/column addressing and read/write, precharge, refresh commands, etc., to memory devices on a selected one of modules 120a–120c. Individual module control lines 150a–150c are typically dedicated to a corresponding one of modules 120a–120c to select which of modules 120a–120c may utilize the control/address bus 130 and data bus 140 in a memory operation.

Here and in the detailed description to follow, "bus" denotes a plurality of signal lines, each having more than two connection points for "transceiving" (i.e., transmitting or receiving). Each connection point electrically connects or couples to a transceiver (i.e., a transmitter-receiver) or one of a single transmitter or receiver circuit With further reference to FIG. 1, memory system 100 may provide an upgrade path through the usage of modules 120a–120c. A socket and connector interface may be employed which allows each module to be removed and replaced by a memory module that is faster or includes a higher capacity. Memory system 100 may be configured with unpopulated sockets or less than a full capacity of modules (i.e., empty sockets/connectors) and provided for increased capacity at a later time with memory expansion modules. Since providing a separate group of signals (e.g., address lines and data lines) to each module is avoided using the bussed approach, system resources in memory system 100 are efficiently utilized.

U.S. Pat. No. 5,513,135 discloses a contemporary dual inline memory module (DIMM) having one or more discrete buffer devices. In this patent, the discrete buffer devices are employed to buffer or register signals between memory devices disposed on the module and external bussing (such as control/address bus 130 in memory system 100). The discrete buffer devices buffer or register incoming control signals such as RAS, and CAS, etc., and address signals. Local control/address lines are disposed on the contemporary memory module to locally distribute the buffered or registered control and address signals to each memory device on the module. By way of note, the discrete buffer devices buffer a subset of all of the signals on the memory module since data path signals (e.g., data bus 140 in FIG. 1) of each memory device are connected directly to the external bus.

In addition to the discrete buffer device(s), a phase locked Loop (PLL) device may be disposed on the contemporary DIMM described above. The PLL device receives an external clock and generates a local phase adjusted clock for each memory device as well as the discrete buffer devices.

Modules such as the DIMM example disclosed in U.S. Pat. No. 5,513,135 feature routed connections between input/outputs (I/Os) of each memory device and connector pads disposed at the edge of the module substrate. These routed connections introduce long stub lines between the signal lines of the bus located off of the module (e.g., control address bus 130 and data bus 140), and memory device I/Os. A stub line is commonly known as a routed connection that deviates from the primary path of a signal line. Stub lines commonly introduce impedance discontinuities to the signal line. Impedance discontinuities may produce undesirable voltage reflections manifested as signal noise that may ultimately limit system operating frequency.

Examples of contemporary memory systems employing buffered modules are illustrated in FIGS. 2A and 2B. FIG. 2A illustrates a memory system 200 based on a Rambus™ channel architecture and FIG. 2B illustrates a memory system 210 based on a Synchronous Link architecture. Both of these systems feature memory modules having buffer devices 250 disposed along multiple transmit/receive connection points of bus 260. In both of these examples, the lengths of stubs are significantly shortened in an attempt to minimize signal reflections and enable higher bandwidth characteristics. Ultimately however, memory configurations such as the ones portrayed by memory systems 100, 200 and 210 may be significantly bandwidth limited by the electrical characteristics inherent in the bussed approach as described below.

In the bussed approach exemplified in FIGS. 1, 2A and 2B, the signal lines of the bussed signals become loaded with a (load) capacitance associated with each bus connection point These load capacitances are normally attributed to components of input/output (I/O) structures disposed on an integrated circuit (IC) device, such as a memory device or buffer device. For example, bond pads, electrostatic discharge devices, input buffer transistor capacitance, and output driver transistor parasitic and interconnect capacitances relative to the IC device substrate all contribute to the memory device load capacitance.

The load capacitances connected to multiple points along the length of the signal line may degrade signaling performance. As more load capacitances are introduced along the signal line of the bus, signal settling time correspondingly increases, reducing the bandwidth of the memory system. In addition, impedance along the signal line may become harder to control or match as more load capacitances are present along the signal line. Mismatched impedance may introduce voltage reflections that cause signal detection errors. Thus, for at least these reasons, increasing the number of loads along the bus imposes a compromise to the bandwidth of the memory system.

In an upgradeable memory system, such as conventional memory system 100, different memory capacity configurations become possible. Each different memory capacity configuration may present different electrical characteristics to the control/address bus 130. For example, load capacitance along each signal line of the control/address bus 130 may change with two different module capacity configurations.

As memory systems incorporate an increasing number of memory module configurations, the verification and validation of the number of permutations that these systems make possible may become increasingly more time consuming. Verification involves the confirmation of operation, logical and/or physical functionality of an IC by running tests on models of the memory, associated devices and/or bus prior to manufacturing the device. Validation involves testing the assembled system or components thereof (e.g., a memory module). Validation typically must account for a majority of the combinations or permutations of system conditions and possibilities which different memory configurations (e.g., 256 Mbyte, 1 Gbyte . . . ) present including signaling, electrical characteristics (e.g., impedance, capacitance, and inductance variations), temperature effects, different operating frequencies, different vendor interfaces, etc, to name a few. Thus, as the number of possible memory configurations increase, the test and verification time required also increases. More time required to test a system often increases the cost of bringing the system to market or delays a product introduction beyond an acceptable window of time to achieve competitiveness.

There is a need for memory system architectures or interconnect topologies that provide cost effective upgrade capabilities without compromising bandwidth. Using conventional signaling schemes, the bussed approaches lend efficiency towards resource utilization of a system and permits module interfacing for upgradeability. However, the bussed approach may suffer from bandwidth limitations that stem from the electrical characteristics inherent in the bus topology. In addition, impedance along a signal line may be increasingly more difficult to control with increased connection points along a signal line, introducing impedance mismatch and signal reflections. Utilizing the bussed approach in implementing an upgradeable memory system introduces many possible electrical permutations and combinations with each unique module configuration.

SUMMARY OF THE INVENTION

The present invention is directed toward memory system architectures (i.e., interconnect topologies) which include a controller communicating to at least one memory subsystem (e.g., a buffered memory module). An independent point-to-point link may be utilized between the controller and each memory subsystem to eliminate physical inter-dependence between memory subsystems. According to an embodiment, the memory system may be upgraded by coupling additional memory module(s), each via a dedicated point-to-point link to the controller. Bandwidth may scale upwards as the memory system is upgraded by the additional memory module(s).

In one aspect, the present invention is a memory system comprising a memory controller having an interface and at least a first memory subsystem. The interface includes a plurality of memory subsystem ports including a first memory subsystem port. The first memory subsystem includes a buffer device having a first port and a second port, and a plurality of memory devices coupled to the buffer device via the second port A plurality of point-to-point inks include a first point-to-point link Each point-to-point link has a connection to a respective memory subsystem port of the plurality of memory subsystem ports. The first point-to-point link connecting the fast port to a first memory subsystem port to transfer data between the plurality of memory devices and the memory controller.

In another aspect, the present invention is a memory system comprising a controller device and first and second buffer devices, each having a first interface and a second interface. A first point-to-point link includes a first connection to the controller device and a second connection to the first interface of the first buffer device. A first channel is connected to the second interface of the first buffer device, and a first plurality of memory devices are electrically coupled to the first channel. A second point-to-point link includes a first connection to the controller device and a second connection to the first interface of the second buffer. A second channel is connected to the second interface of the second buffer device, and a second plurality of memory devices are electrically coupled to the second channel.

In yet another aspect, the present invention comprises a controller device, and a first and second plurality of buffer devices, each buffer device having a first interface connected to a plurality of memory devices. First and second point-to-point links each include a first end connected to the controller device and a second end connected to a repeater device. A plurality of repeater links couple the first and second repeater devices to respective first and second pluralities of buffer devices.

In another aspect the present invention is a memory system comprising a controller device; a fist, second and third connectors; and first second and third point-to-point links. Each of the respective first, second point-to-point links includes a first connection to the interface and a second connection to the respective first, second and third connectors. In this aspect the present invention also includes a first memory subsystem having a buffer device and a plurality of memory devices. The buffer device includes a first interface connected to the first connector, and a second interface connected to the plurality of memory devices. The second and third connectors may support coupling to respective second and third memory subsystems.

The present invention is described in the detailed description, including the embodiments to follow. The detailed description and embodiments are given by way of illustration only. The scope of the invention is defined by the attached claims. Various modifications to the embodiments of the present invention remain within the scope defined by the attached claims.

BRIEF DESCRIPTION OF THE DRAWINGS

In the course of the detailed description to follow, reference will be made to the attached drawings, in which.

DETAILED DESCRIPTION

The present invention relates to a memory system which includes a plurality of point-to-point links connected to a master. At least one point-to-point link connects at least one memory subsystem to the master, (e.g., a processor or controller). The memory system may be upgraded by coupling memory subsystems to the master via respective dedicated point-to-point links. Each memory subsystem includes a buffer device that communicates to a plurality of memory devices. The master communicates with each buffer device via each point-to-point link The buffer device may be disposed on a memory module along with the plurality of memory devices and connected to the point-to-point link via a connector. Alternatively, the buffer device may be disposed on a common printed circuit board or backplane link along with the corresponding point-to-point link and master.

"Memory devices" are a common class of integrated circuit devices that have an array of memory cells, such as, dynamic random access memory (DRAM), static random access memory (SRAM), etc. A "memory subsystem" is a plurality of memory devices interconnected with an integrated circuit device (e.g., a buffer device) providing access between the memory devices and an overall system, for example, a computer system. It should be noted that a memory system is distinct from a memory subsystem in that a memory system may include one or more memory subsystems. A "memory module" or simply just "module" denotes a substrate having a plurality of memory devices employed with a connector interface. It follows from these definitions that a memory module having a buffer device isolating data, control, and address signals of the memory devices from the connector interface is a memory subsystem.

Figure 3A:
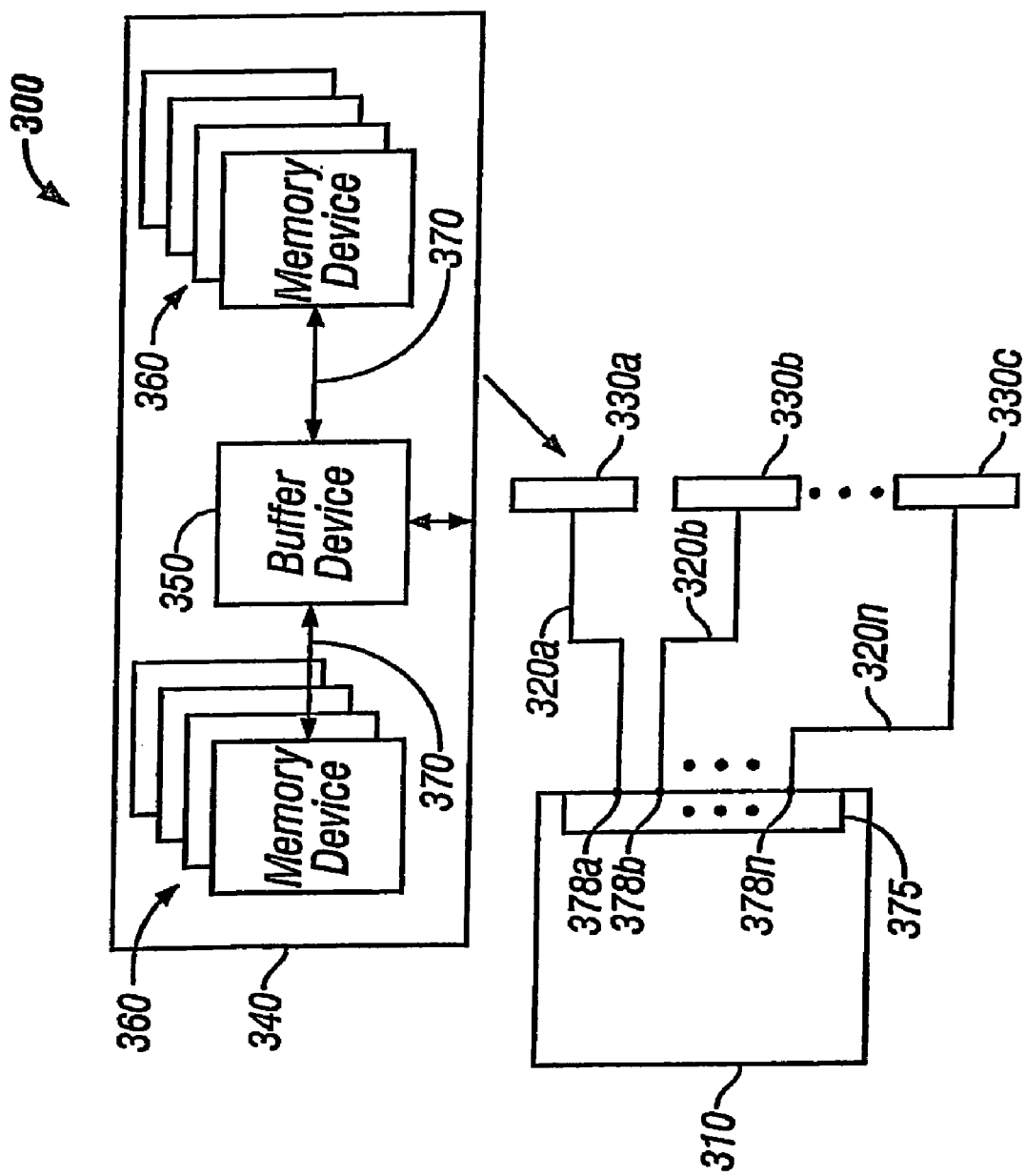
FIG. 3A and 3B illustrate a block diagram representing memory systems according to embodiments of the present invention.
Figure 3B:
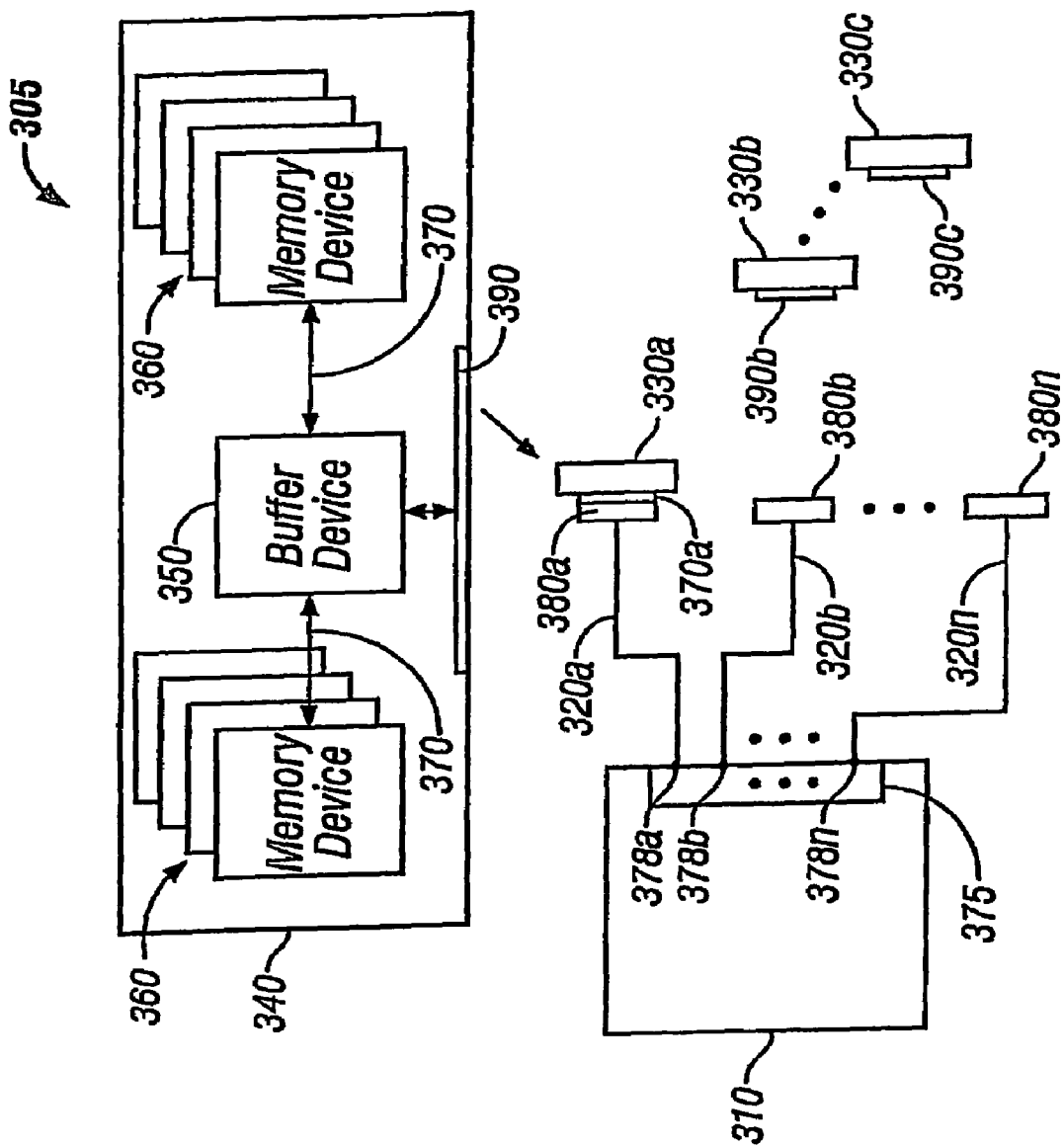

With reference to FIG. 3A and 3B, block diagrams of a memory system according to embodiments of the present invention are illustrated. Memory systems 300 and 305 include a controller 310, a plurality of point-to-point links 320a–320n, and a plurality of memory subsystems 330a–330n. For simplicity, a more detailed embodiment of memory subsystem 330a is illustrated as memory subsystem 340. Buffer device 350 and a plurality of memory devices 360 are disposed on memory subsystem 340. Buffer device 350 is coupled to the plurality of memory devices 360 via channels 370. Interface 375 disposed on controller 310 includes a plurality of memory subsystem ports 378a–378n. A "port" is a portion of an interface that serves a congruent I/O functionality. One of memory subsystem ports 378a–378n includes I/Os, for sending and receiving data, addressing and control information over one of point-to-point links 320a–320n.

According to an embodiment of the present invention, at least one memory subsystem is connected to one memory subsystem port via one point-to-point link The memory subsystem port is disposed on the memory controller interface which includes a plurality of memory subsystem ports, each having a connection to a point-to-point link.

In FIG. 3A, point-to-point links 320a–320n, memory subsystems 330a–330c, and controller 310, are incorporated on a common substrate (not shown) such as a wafer or a printed circuit board (PCB) in memory system 300. In an alternate embodiment, memory subsystems are incorporated onto individual substrates (e.g., PCBs) that are incorporated fixedly attached to a single substrate that incorporates point-to-point links 320a–320n and controller 310. In another alternate embodiment illustrated in FIG. 3B, memory subsystems 330a–330c are incorporated onto individual substrates which include connectors 390a–390c to support upgradeability in memory system 305. Corresponding mating connectors 380a–380n are connected to a connection point of each point-to-point link 320a–320a. Each of mating connectors 380a–380n interface with connectors 390a–390c to allow removal/inclusion of memory subsystems 330a–330c in memory system 305. In one embodiment, mating connectors 380a–380n are sockets and connectors 390a–390c are edge connectors disposed on an edge of each substrate 330a–330c. Mating connectors 380a–380n, are attached to a common substrate shared with point-to-point connections 320a–320n and controller 310.

With further reference to FIGS. 3A and 3B, buffer device 350 transceives and provides isolation between signals interfacing to controller 310 and signals interfacing to the plurality of memory devices 360. In a normal memory read operation, buffer device 350 receives control, and address information from controller 310 via point-to-point link 320a and in response, transmits corresponding signals to one or more, or all of memory devices 360 via channel 370. One or more of memory devices 360 may respond by transmitting data to Buffer device 350 which receives the data via one or more of channels 370 and in response, transmits corresponding signals to controller 310 via point-to-point link 320a Controller 310 receives the signals corresponding to the data at corresponding port 378a–378n. In this embodiment, memory subsystems 330a–330n are buffered modules. By way of comparison, buffers disposed on the conventional DIMM module in U.S. Pat. No. 5,513,135 are employed to buffer or register control signals such as RAS, and CAS, etc., and address signals. Data I/Os of the memory devices disposed on the DIMM are connected directly to the DIMM connector (and ultimately to data lines n an external bus when the DIMM is employed in memory system 100).

Buffer device 350 provides a high degree of system flexibility. New generations of memory devices may be phased in with controller 310 or into memory system 300 by modifying buffer device 350. Backward compatibility with existing generations of memory devices (i.e., memory devices 360) may also be preserved. Similarly, new generations of controllers may be phased in which exploit features of new generations of memory devices while retaining backward compatibility with existing generations of memory devices.

Figure 1:
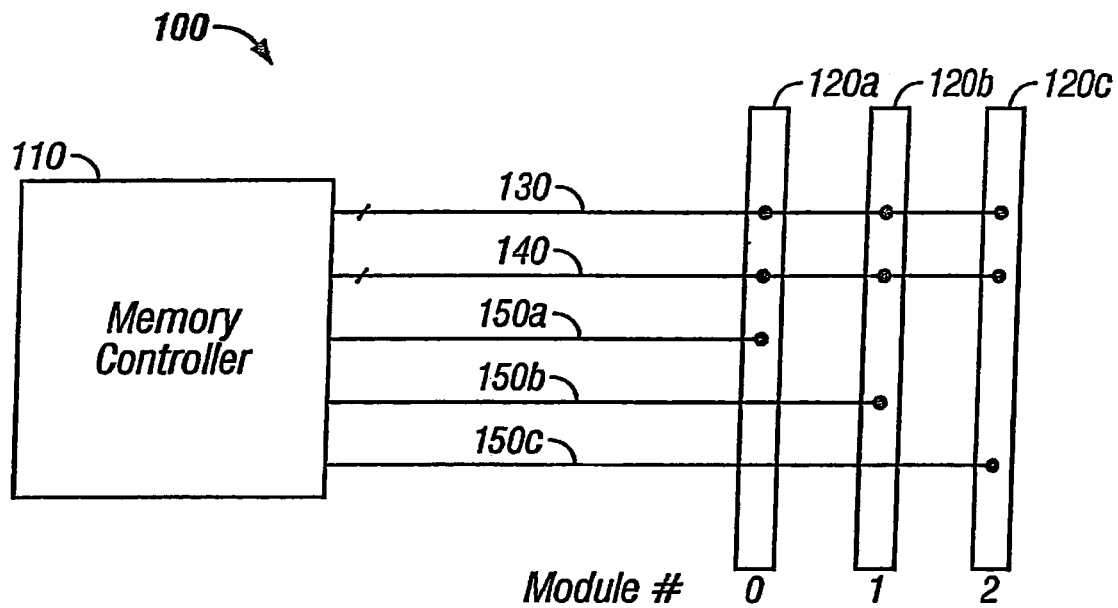
FIG. 1 illustrates a representational block diagram of a conventional memory system employing memory modules.

Buffer device 350 effectively reduces the number of loading permutations on the corresponding point-to-point link to one, thus simplifying test procedures. For examples characterization of a point to point link may involve aspects such as transmitters and receivers at opposite ends, few to no impedance discontinuities, and relatively short interconnects. By way of contrast, characterization of control/address bus 130 (see FIG. 1) may involve aspects such as multiple transmit and receive points, long stub lines, and multiple load configurations, to name a few. Thus, the increased number of electrical permutations tend to add more complexity to the design, test, verification and validation of memory system 100.

Buffered modules added to upgrade memory system 300 (e.g., increase memory capacity) are accommodated by independent point-to-point links. Relative to a bussed approach, system level design, verification and validation considerations are reduced, due to the decreased amount of module inter-dependence provided by the independent point-to-point links. Additionally, the implementation, verification and validation of buffered modules may be performed with less reliance on system level environment factors.

Several embodiments of point-to-point links 320a–320n include a plurality of link architectures, signaling options, clocking options and interconnect types. Embodiments having different link architectures include simultaneous bidirectional links, time-multiplexed bi-directional links and multiple unidirectional links. Voltage or current mode signaling may be employed in any of these link architectures. Clocking methods include any of globally synchronous clocking; source synchronous clocking (i.e., where data is transported alongside the clock) and encoding the data and the clock together. In one embodiment, differential signaling is employed and is transported over differential pair lines. In alternate embodiments, one or more common voltage or current references are employed with respective one or more current/voltage mode level signaling. In yet other embodiments, multi-level signaling-where information is transferred using symbols formed from multiple signal (I.e., voltage/current) levels is employed Signaling over point-to-point links 320a–320n may incorporate different modulation methods such as non-return to zero (NRZ), multi-level pulse amplitude modulation (PAM), phase shift keying, delay or time modulation, quadrature amplitude modulation (QAM) and Trellis coding. Other signaling methods and apparatus may be employed in point-to-point links 320a–320n, for example, optical fiber based apparatus and methods.

The term "point-to-point line" denotes one or a plurality of signal lines, each signal line having only two transceiver connection points, each transceiver connection point coupled to transmitter circuitry, receiver circuitry or transceiver circuitry. For example, a point-to-point link may include a transmitter coupled at or near one end and a receiver coupled at or near the other end. The point-to-point link may be synonymous and interchangeable with a point-to-point connection or a point-to-point coupling.

In keeping with the above description, the number of transceiver points along a signal line distinguishes between a point-to-point link and a bus. According to the above, the point-to-point link consists of two transceiver connection points while a bus consists of more than two transceiver points.

One or more terminators (e.g., a resistive element) may terminate each signal line in point-to-point links 320a–320n. In several embodiments of the present invention, the terminators are connected to the point-to-point link and situated on buffer device 350, on a memory module substrate and optionally on controller 310 at memory subsystem ports 378a–378n. The terminator(s) connect to a termination voltage, such as ground or a reference voltage. The terminator may be matched to the impedance of each transmission line in point-to-point links 320a–320n, to help reduce voltage reflections.

In an embodiment of the present invention employing multi-level PAM signaling, the data rate may be increased without increasing either the system clock frequency or the number of signal lines by employing multiple voltage levels to encode unique sets of consecutive digital values or symbols. That is, each unique combination of consecutive digital symbols may be assigned to a unique voltage level, or pattern of voltage levels. For example, a 4-level PAM scheme may employ four distinct voltage ranges to distinguish between a pair of consecutive digital values or symbols such as 00, 01, 10 and 11. Here, each voltage range would correspond to one of the unique pairs of consecutive symbols.

Figure 4A:
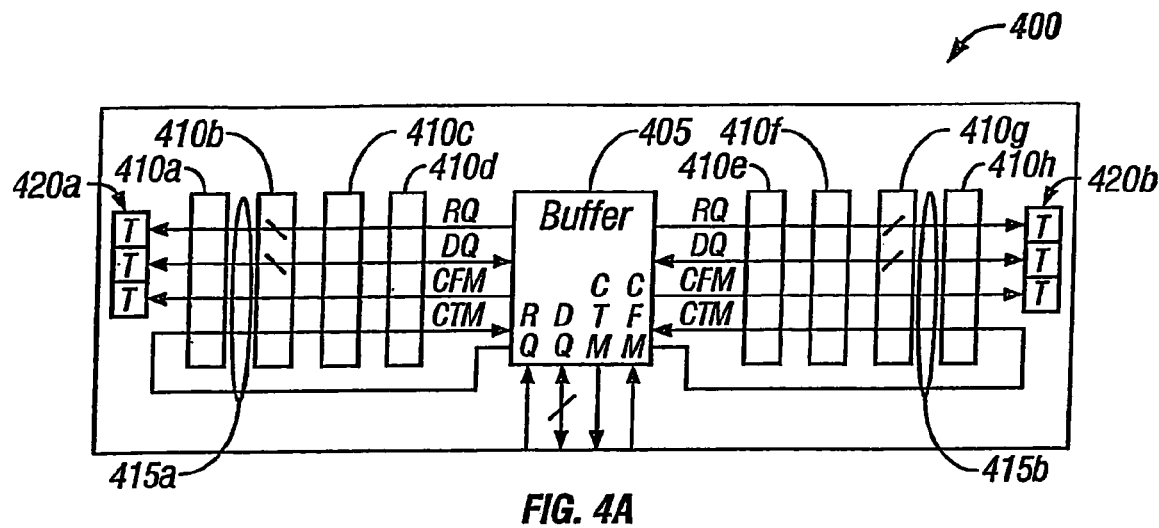
FIGS. 4A, 4B, and 4C illustrate buffered memory modules according to embodiments of the present invention.
Figure 4B:
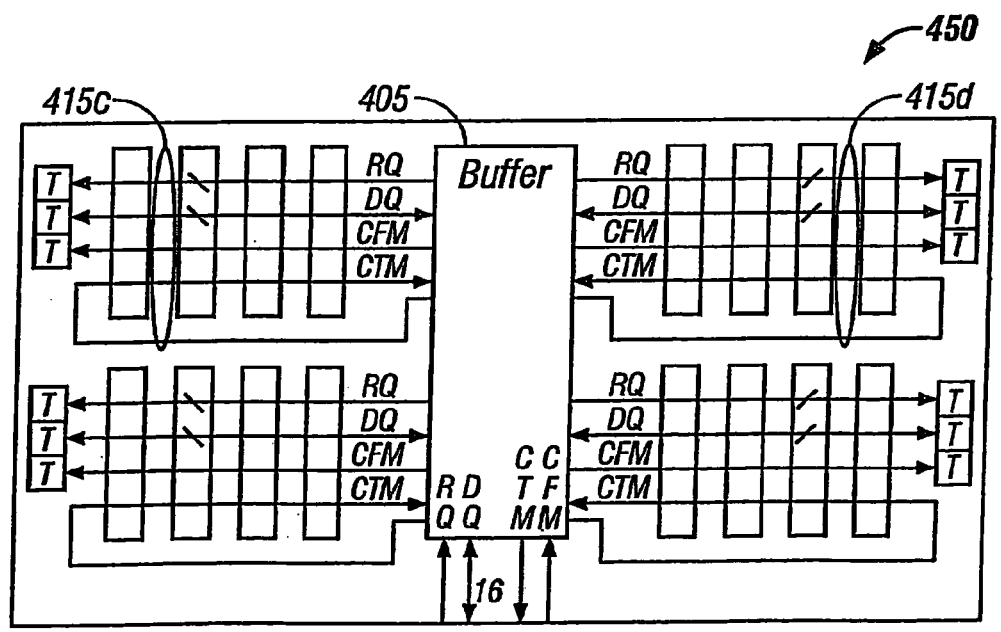
Figure 4C:
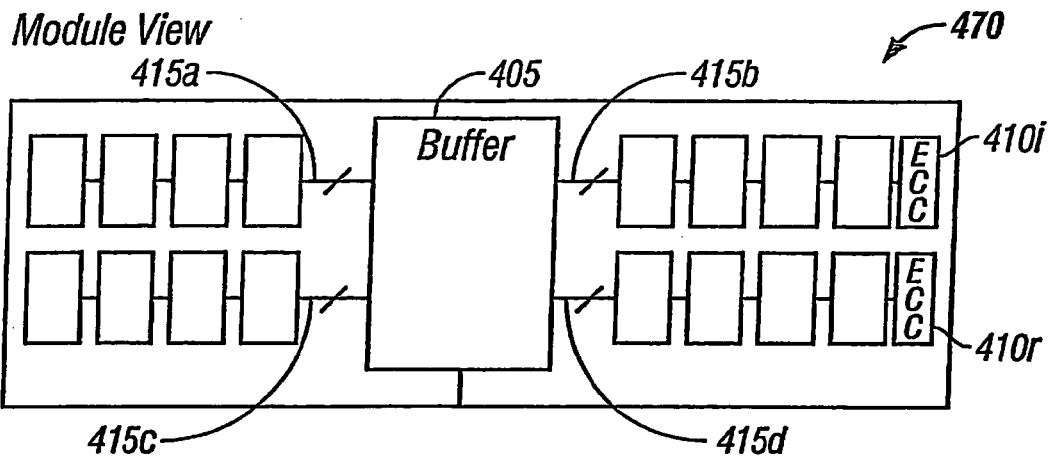

With reference to FIGS. 4A, 4B and 4C, buffered memory modules according to embodiments of the present invention are shown. Modules 400 and 405 include buffer device 405 and a plurality of memory devices 410a–410h communicating over a pair of channels 415a and 415b. In these embodiments channel 415a communicates to memory devices 410a–410d and channel 415b communicates to memory devices 410e–410h.

Figure 2A:
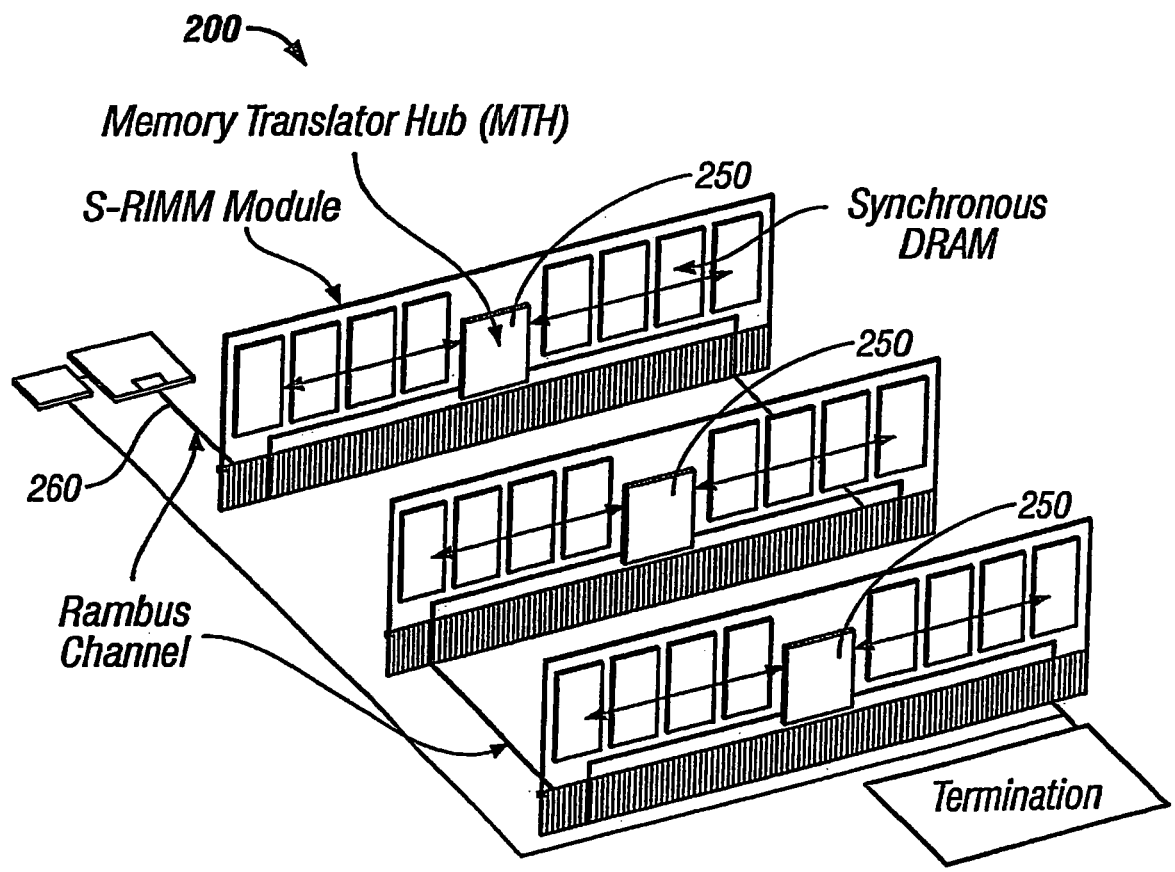
FIGS. 2A and 2B illustrate contemporary memory systems employing buffered modules.
Figure 2B:
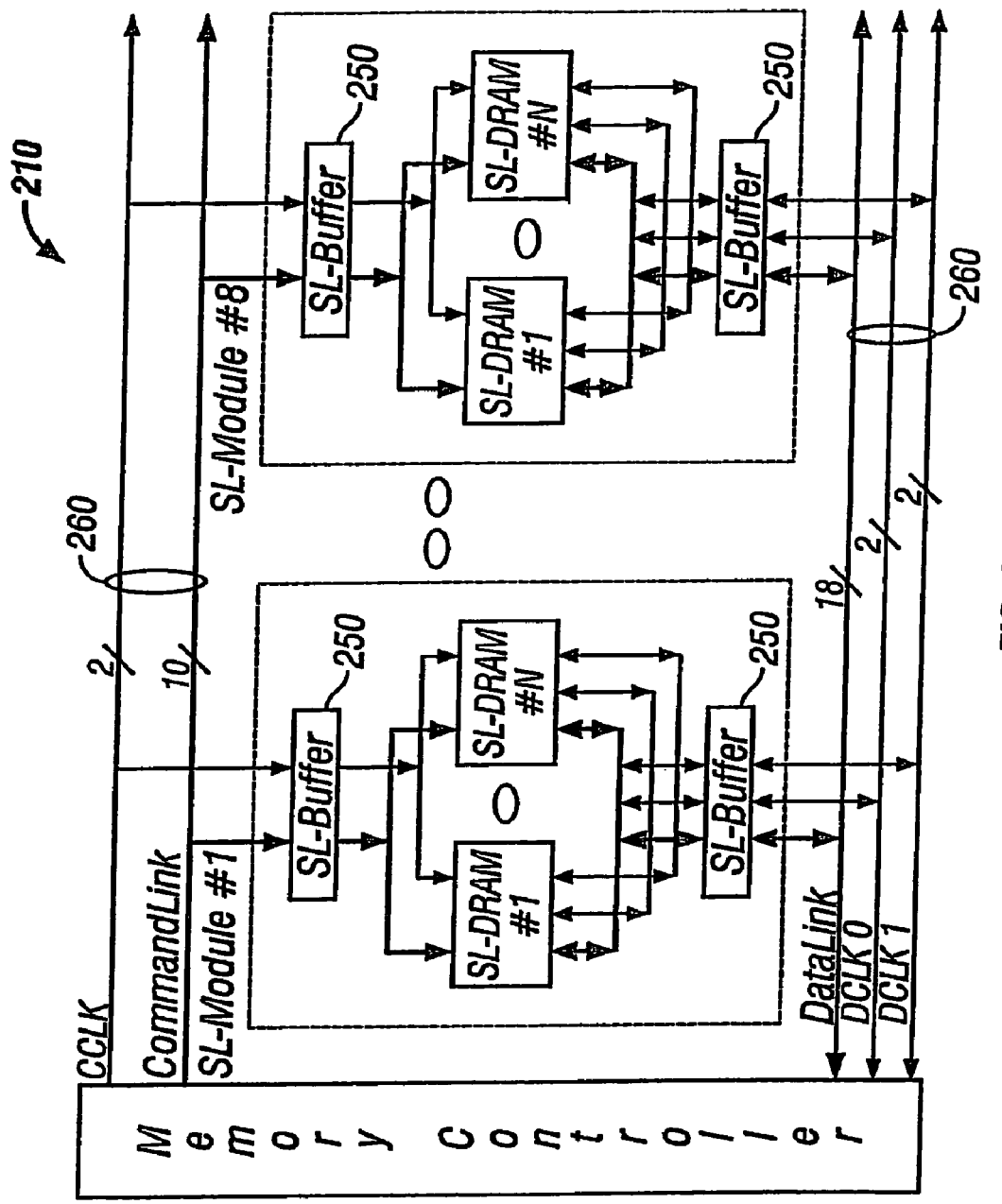

In an embodiment, channels 415a and 415b consist of a plurality of signal lines in a relatively short multi-drop bus implementation. The plurality of signal lines may be controlled impedance transmission lines that are terminated using respective termination elements 420a and 420b. Channels 415a and 415b are relatively short (i.e., are coupled to relatively few memory devices relative to a conventional memory system, for example see FIGS. 2A and 2B) and connect to an I/O interface (not shown) of each memory device via a short stub. Signal lines of channels 415a and 415b include control lines (RQ), data lines (DQ) and clock lines (CFM, CTM). The varieties of interconnect topologies, interconnect types, clocking methods, signaling references, signaling methods, and signaling apparatus described above in reference to point-to-point links 320a–320n may equally apply to channels 415a and 415b.

In accordance with an embodiment of the present invention, control lines (RQ) transport control (e.g., read, write, precharge . . . ) information and address (e.g., row and column) information contained in packets. By bundling control and address information in packets, protocols required to communicate to memory devices 410a–410h are independent of the physical control/address interface implementation In alternate embodiments, control lines (RQ) may comprise individual control lines, for example, row address strobe, column address strobe, etc., and address lines. Individual point-to-point control and address lines increase the number of parallel signal connection paths, thereby increasing system layout resource requirements with respect to a narrow "packet protocol" approach. In one alternate embodiment illustrated in FIG. 6A, individual device select lines 633a and 633b are employed to perform device selection. Individual device select lines 633a and 633b decrease some latency consumed by decoding device identification which normally is utilized when multiple devices share the same channel and incorporate individual device identification values.

Clock lines of channels 415a and 415b include a terminated clock-to-master (CTM) (i.e., clock to buffer) and clock-from-master (CFM) (i.e., clock from buffer) line. In a source synchronous clocking method, CTM may be transition or edge aligned with control and/or data communicated to buffer device 405 from one or more of memory devices 410a–410d in, for example, a read operation. CFM may be aligned with or used to synchronize control and/or data from the buffer to memory in, for example, a write operation.

Although two channels 415a and 415b are shown in FIG. 4A, a single channel is also feasible. In other embodiments, more than two channels may be incorporated onto module 400. It is conceivable that if each channel and memory device interface is made narrow enough, then a dedicated channel between each memory device and the buffer device may be implemented on the module. The width of the channel refers to the number of parallel signal paths included in each channel. FIG. 4B illustrates a quad-channel module 450 having channels 415a–415d. In this embodiment, channels 415c and 415d are routed in parallel with channels 415a and 415b to support more memory devices (e.g. 32 memory devices). By incorporating more channels and additional memory devices, module 400 (FIG. 4B) may be implemented in memory systems that require large memory capacity, for example, in server or workstation class systems.

In alternate embodiments, channels 415a and 415b may operate simultaneously with channels 415c and 415d to realize greater bandwidth. By operating a plurality of channels in parallel, the bandwidth of the module may be increased independently of the memory capacity. The advantages of greater bandwidth may be realized in conjunction with larger capacity as more modules incorporated the memory system 305 (see FIG. 3B) increase the system memory capacity. In other alternate embodiments, the modules are double sided and channels along with corresponding pluralities of memory devices are implemented on both sides. Using both sides of the module increases capacity or increases bandwidth without impacting module height Both capacity and bandwidth may increase using this approach. Indeed, these techniques may increase capacity and bandwidth singly or in combination.

Other features may also be incorporated to enhance module 400 in high capacity memory systems, for example, additional memory devices and interface signals for error correction code storage and transport (ECC). Referring to FIG. 4C, memory devices 410i and 410r intended for ECC are disposed on module 470.

In one embodiment, memory devices 410a–410h are Rambus Dynamic Random access Memory (RDRAM) devices operating at a data rate of 1066 Mbits/sec. Other memory devices may be implemented on module 400, for example, Double Data Rate (DDR) DRAM devices and Synchronous DRAM (SDRAM) devices. Utilizing buffer device 405 between the memory devices and controller in accordance with the present invention (e.g., see FIG. 3) may feasibly render the type of memory device transparent to the system. Different types of memory devices may be included on different modules within a memory system, by employing buffer device 405 to translate protocols employed by controller 310 to the protocol utilized in a particular memory device implementation.

Figure 5:
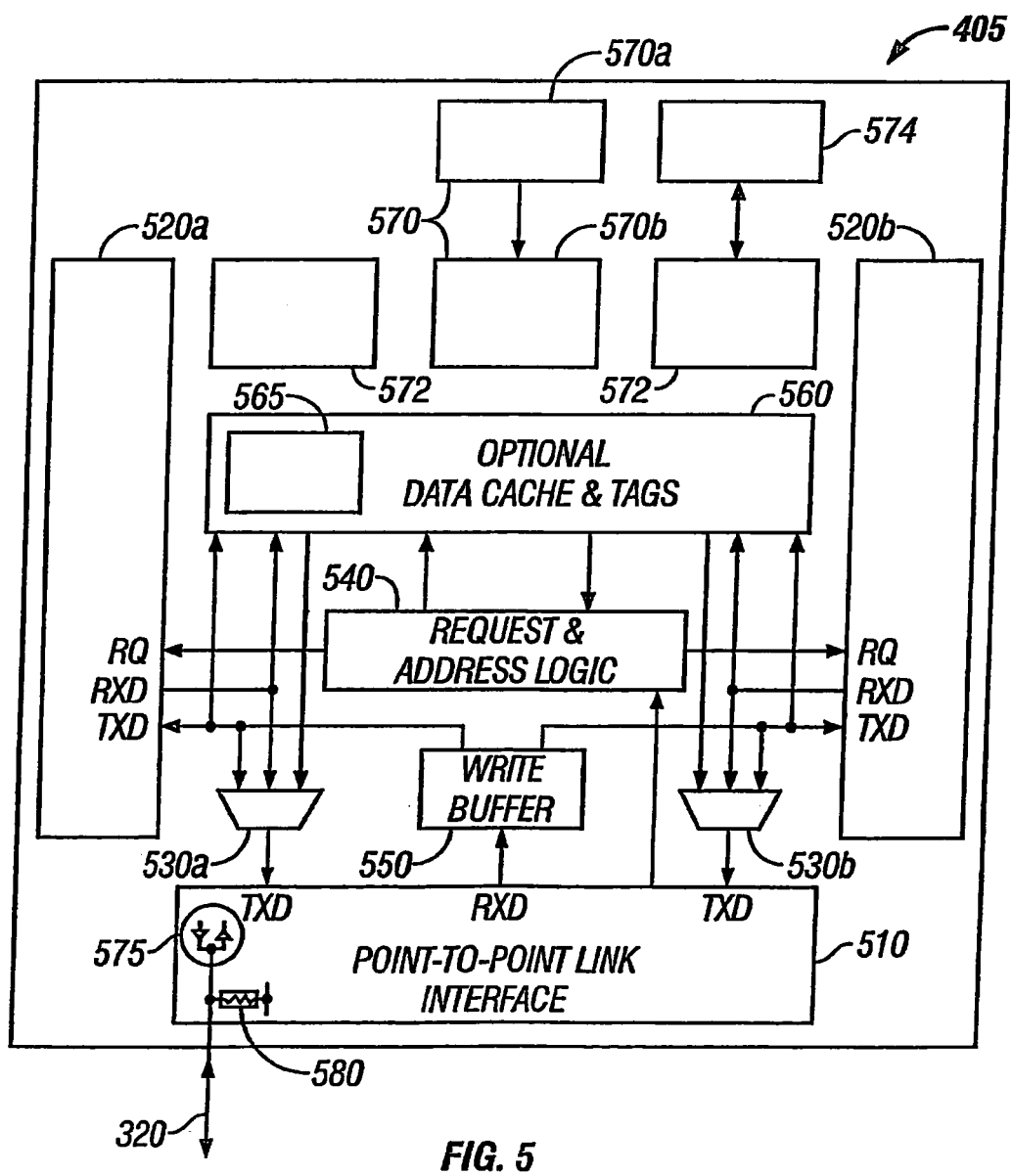
FIG. 5 illustrates a block diagram of a buffer device according to another embodiment of the present invention.

With reference to FIG. 5, a block diagram of a buffer device according to an embodiment of the present invention is illustrated. Buffer device 405 includes interface 510, interface 520a and 520b, multiplexing 530a and 530b, control logic 540, write buffer 550, optional cache 560, computation block 565, clock circuitry 570 and operations circuitry 572.

In an embodiment, interface 510 couples to external point-to-point link 320 (e.g., point-to-point links 320a–320n in FIGS. 3A and 3B). Interface 510 includes a port having transceiver 575 (i.e. transmit and receive circuitry) that connects to a point-to-point link. Point-to-point link 320 comprises one or a plurality of signal lines, each signal line having no more than two transceiver connection points. One of the two transceiver connection points is included on interface 510. Buffer device 405 may include additional ports to couple additional point-to-point links between buffer device 405 and other buffer devices on other memory modules. These additional ports may be employed to expand memory capacity as is described in more detail below. In the embodiment shown in FIG. 5, buffer device 405 may function as a transceiver between point-to-point link 320 and other point-to-point links.

In one embodiment, termination 580 is disposed on buffer device 405 and is connected to transceiver 575 and point-to-point link 320. In this embodiment, transceiver 575 includes an output driver and a receiver. Termination 580 may dissipate signal energy reflected (i.e., a voltage reflection) from transceiver 575. Termination 580 may be a resistor or capacitor or inductor, singly or a series/parallel combination thereof. In alternate embodiments, termination 580 may be external to buffer device 405. For example, termination 580 may be disposed on a module substrate or on a memory system substrate.

In another approach, signal energy reflected from transceiver 575 may be utilized in a constructive manner according to an embodiment. By correctly placing a receive point spaced by a distance from the end of point-to-point link 320, a reflected waveform is summed with an incident waveform to achieve a greater signal amplitude. In this approach, layout space may be saved by eliminating termination 580. System power may also be saved using this approach since smaller incident voltage amplitude waveforms may be employed. This approach may be equally applicable to the transceiver end of the point-to-point link, or to channels 415a and 415b (see FIGS. 4A to 4C).

With further reference to FIG. 5, interfaces 520a and 520b receive and transmit to memory devices disposed on the module (e.g., see FIGS. 4A, 4B and 4C) via channels. Ports included on interface 520a and 520b connect to each channel. In alternate embodiments of the present invention, interfaces 520a and 520b include any number of channels e.g., two, four, eight or more channels.

According to an embodiment of the present invention, multiplexers 530a and 530b perform bandwidth-concentrating operations, between interface 510 and interfaces 520a and 520b. The concept of bandwidth concentration involves combining the (smaller) bandwidth of each channel in a multiple channel embodiment to match the (higher) overall bandwidth utilized in a smaller group of channels. This approach typically utilizes multiplexing and demultiplexing of throughput between the multiple channels and smaller group of channels. In an embodiment, buffer device 405 utilizes the combined bandwidth of interfaces 520a and 520b to match the bandwidth of interface 510. Bandwidth concentration is described in more detail below.

Cache 560 is one performance enhancing feature that may be incorporated onto buffer device 405. Employing a cache 560 may improve memory access time by providing storage of most frequently referenced data and associated tag addresses with lower access latency characteristics than those of the memory devices. Computation block 565 may include a processor or controller unit, a compression/decompression engine, etc, to further enhance the performance and/or functionality of the buffer device. In an embodiment, write buffer 550 may improve-interfacing efficiency by utilizing available data transport windows over point-to-point link 320 to receive write data and optional address/mask information. Once received, this information is temporarily stored in write buffer 550 until it is ready to be transferred to at least one memory device over interfaces 520a and 520b.

A serial interface 574 may be employed to couple signals utilized in initialization of module or memory device identification values, test function, set(reset, access latency values, vendor specific functions or calibration. Operations circuitry 572 may include registers or a read-only memory (ROM) to store special information (e.g., vendor or configuration information) that may be used by the controller. Operations circuitry may reduce costs by eliminating the need for separate devices on the module conventionally provided to perform these features (e.g., serial presence detect (SPD) employed in some conventional DIMM modules).

According to an embodiment of the present invention, sideband signals are employed to handle special functions such as reset, initialization and power management functions. Sideband signals are connected via serial interface 574 and are independent from point-to-point link 320 for handling the special functions. In other embodiments sideband signals are independently coupled to memory devices 410a–10h to directly promote initialization, reset, power-up or other functionality independently of buffer device 405. Other interconnect topologies of sideband signals are possible. For example, sideband signals may be daisy chained between buffer devices and coupled to the memory controller or daisy chained between all memory devices to the memory controller. Alternatively, dedicated sideband signals may be employed throughout.

Clock circuitry 570 may include clock generator circuitry (e.g., Direct Rambus Clock Generator) which may be incorporated onto buffer device 405 and thus may eliminate the need for a separate clock generating device. Here, module or system costs may be decreased since the need for a unique clock generator device on the module or in the system may be eliminated. Since reliability to provide adequate clocking on an external device is eliminated, complexity is reduced since the clock may be generated on the buffer device 570. By way of comparison, some of the conventional DMM modules require a phase lock loop (PLL) generator device to generate phase aligned clock signals for each memory device disposed on the module.

According to an embodiment of the present invention, clocking circuitry 570 includes one or more clock alignment circuits for phase or delay adjusting internal clock signals with respect to an external clock (not shown). Clock alignment circuitry may utilize an external clock from an existing clock generator, or an internal clock generator to provide an internal clock, to generate internal synchronizing clock signals having a predetermined temporal relationship.

Figure 6A:
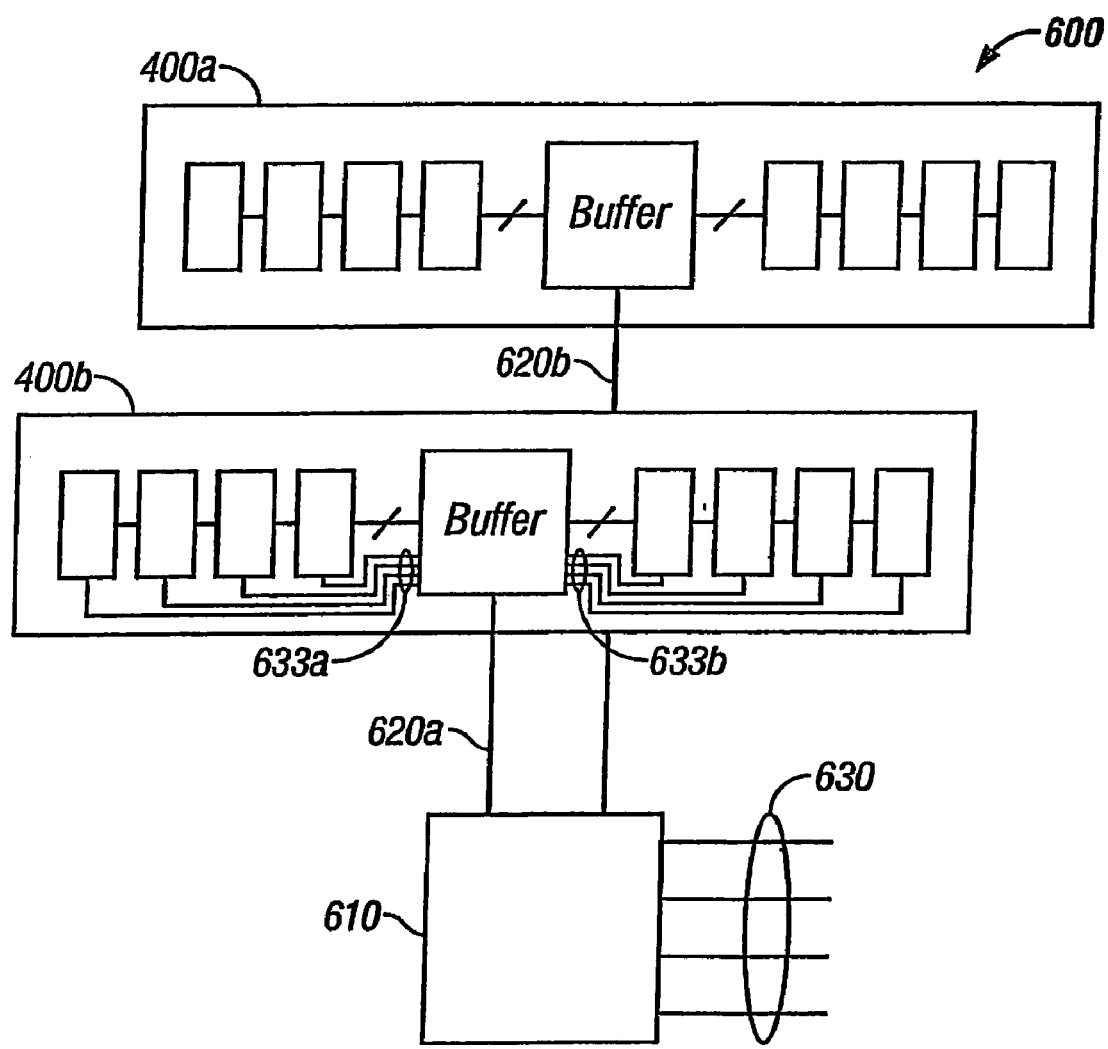
FIGS. 6A and 6B illustrate block diagrams of a memory system according to other embodiments of the present invention.
Figure 6B:
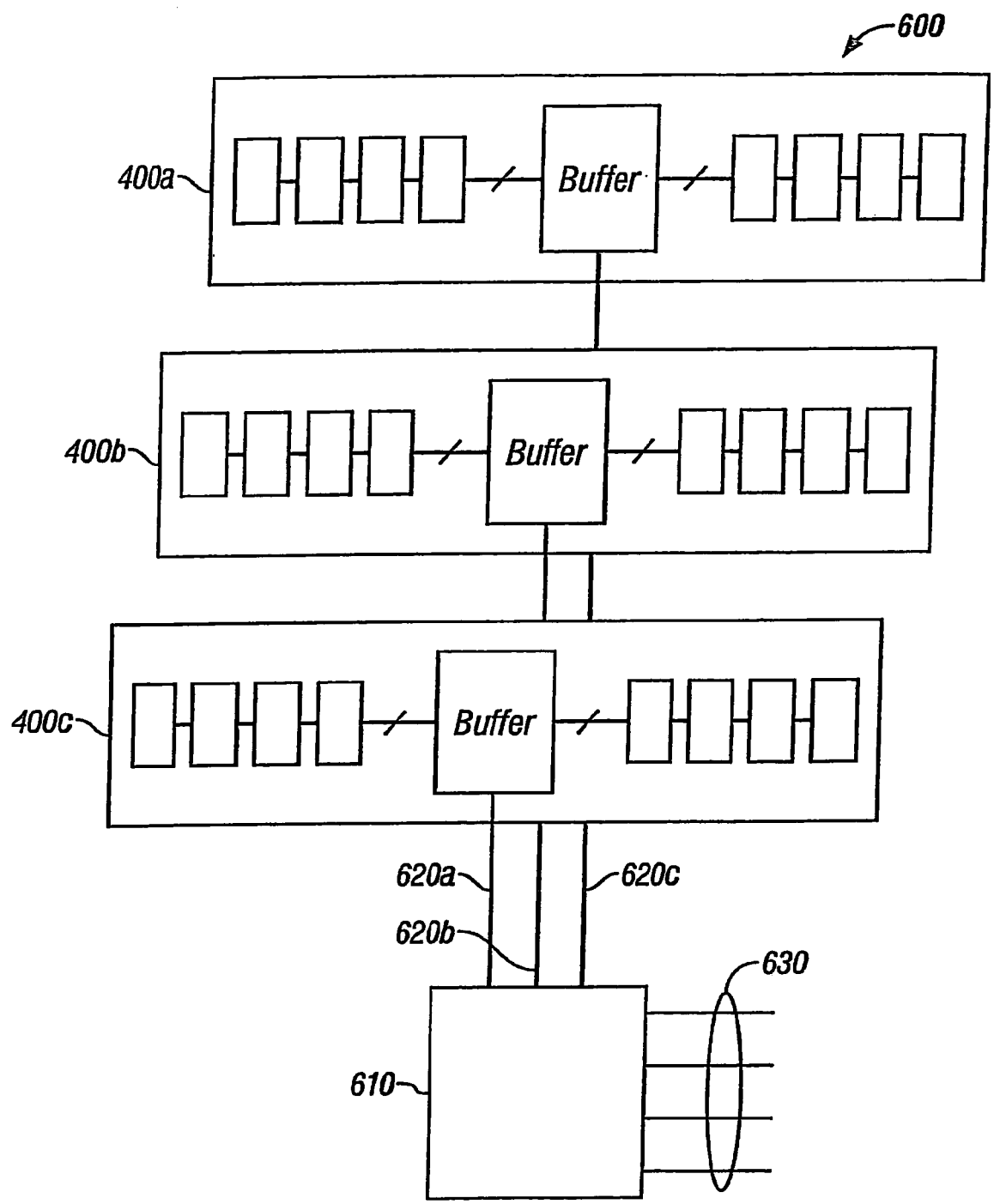

With reference to FIGS. 6A, and 6B, block diagrams of a memory system according to embodiments of the present invention are illustrated. Memory system 660 includes modules 400a and 400b, controller 610, and populated primary point-to-point links 620a and 620b. Unpopulated primary point-to-point links 630 are populated by coupling additional modules (not shown) thereto. The additional modules may be provided to upgrade memory system 600. Connectors may be disposed at an end of each primary point-to-point link to allow insertion or removal of the additional modules. Modules 400a and 400b may also be provided with a connector or may be fixedly disposed (i.e., soldered) in memory system 600. Although only two populated primary point-to-point links are shown in FIG. 6A, any number of primary point-to-point links may be disposed in memory system 600, for example, tree primary point-to-point links 400a–400c, as shown in FIG. 6B.

Figure 7:
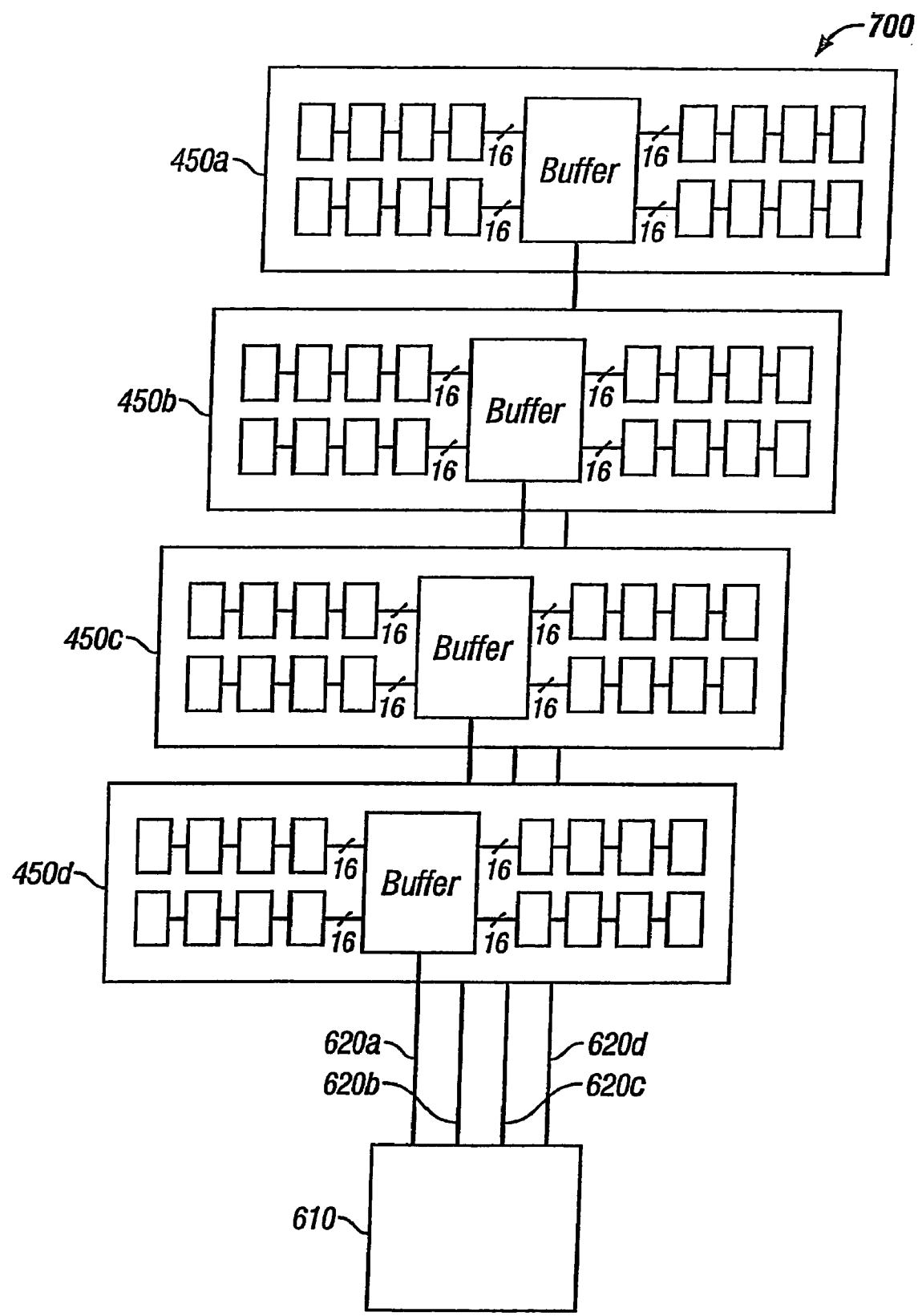
FIG. 7 illustrates a block diagram of a memory system employing a buffered quad-channel module according to an embodiment of the present invention.

With reference to FIG. 7 and FIG. 4B, a block diagram of a memory system employing a buffered quad-channel module according to an embodiment of the present invention is illustrated. Memory systems 700 incorporate quad-channel modules 450a–450d, each coupled via point-to-point links 620a–620d respectively.

Referring to FIG. 4B, buffer device 405 may operate in a bandwidth concentrator approach. By employing quad channels 415a–415d on each of modules 450a–450d, bandwidth in each module may be concentrated from all quad channels 415a–415d on each module to corresponding point-to-point links 620a–620d. In this embodiment, throughput on each of point-to-point links 620a–620d is concentrated to four times the throughput achieved on each of quad channels 415a–415d. Here, each of channels 415a–415d transfers information between one or more respective memory devices on each channel and buffer device 405 simultaneously.

Any number of channels 415a–415d, for example; two channels 415c and 415d may transfer information simultaneously and the memory devices on the other two channels 415a and 415b remain in a ready or standby state until called upon to perform memory access operations. Different applications may have different processing throughput requirements. In addition, the throughput requirements of a particular application may dynamically change during processing Typically, more power is consumed as throughput is increased as power consumption relates in proportion to operation frequency. The amount of throughput in a system may be implemented on a dynamic throughput requirement basis to save on power consumption. In this embodiment, memory system 700 may concentrate bandwidth as it is required while in operation. For example, memory system 700 may employ only one of channels 415a–415d and match throughput to the corresponding point-to-point link As bandwidth requirements increase, memory system 700 may dynamically activate more of channels 415a–415d and increase the throughput on the point-to-point link along with the number of channels accordingly to meet the bandwidth requirements for a given operation.

Figure 8A:
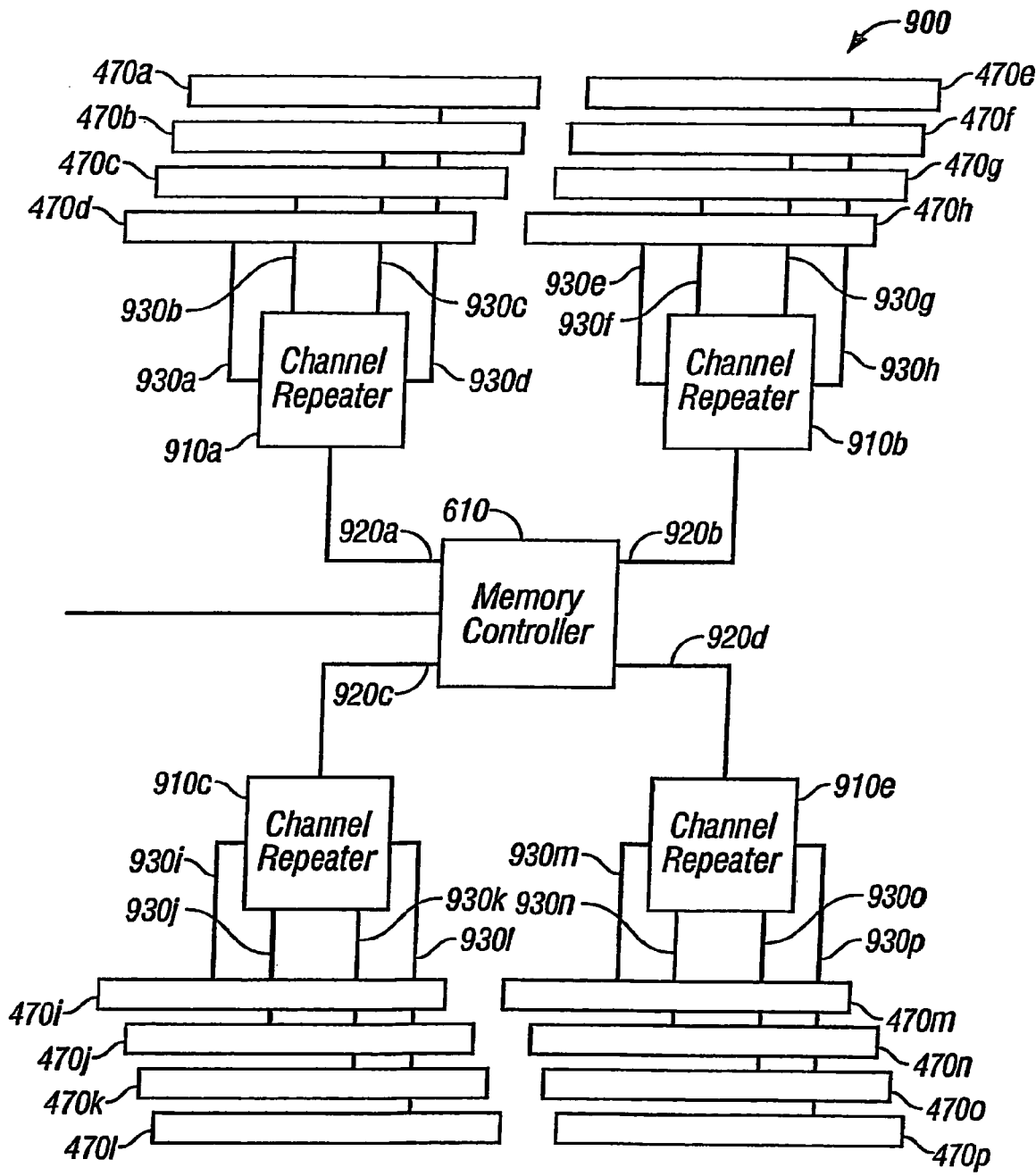
FIG. 8A illustrates a block diagram of a large capacity memory system according to another embodiment of the present invention.

With reference to FIG. 8A, a block diagram of a large capacity memory system according to an embodiment of the present invention is illustrated. Memory system 900 includes modules 470a–470p, coupled to controller 610 via repeaters 910a–910d, primary links 920a–920d, and repeater links 930a–930p. Primary links 920a–920d provide a point to point link between controller 610 and a respective repeater 910a–910d. In an embodiment of the present invention, each of repeaters 910a–910d decode packets transmitted from controller 610 which are then directed over one or more, or none of repeater links 930a–d, depending the type of access required. Each repeater link 930a–930p may utilize a point-to-point link configuration. By incorporating, repeated link 930a–930p and repeaters 910a–910d, a larger number of modules may be accessed and a larger capacity memory system may be real Such a large capacity may be suited in a computer server system.

Figure 8B:
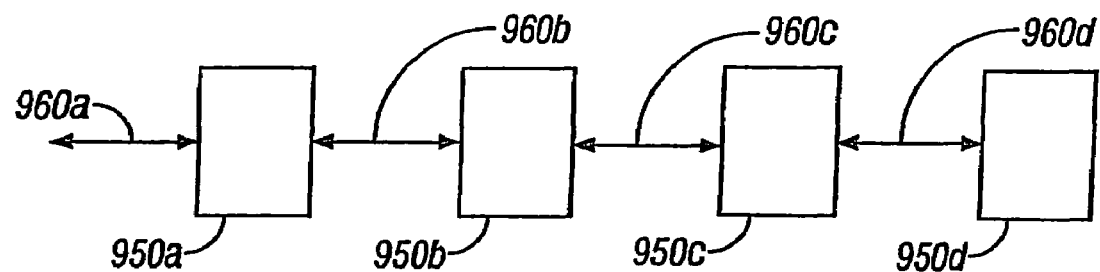
FIGS. 8B and 8C illustrate another approach utilized to expand the memory capacity of a memory system in accordance to yet another embodiment of the present invention.
Figure 8C:
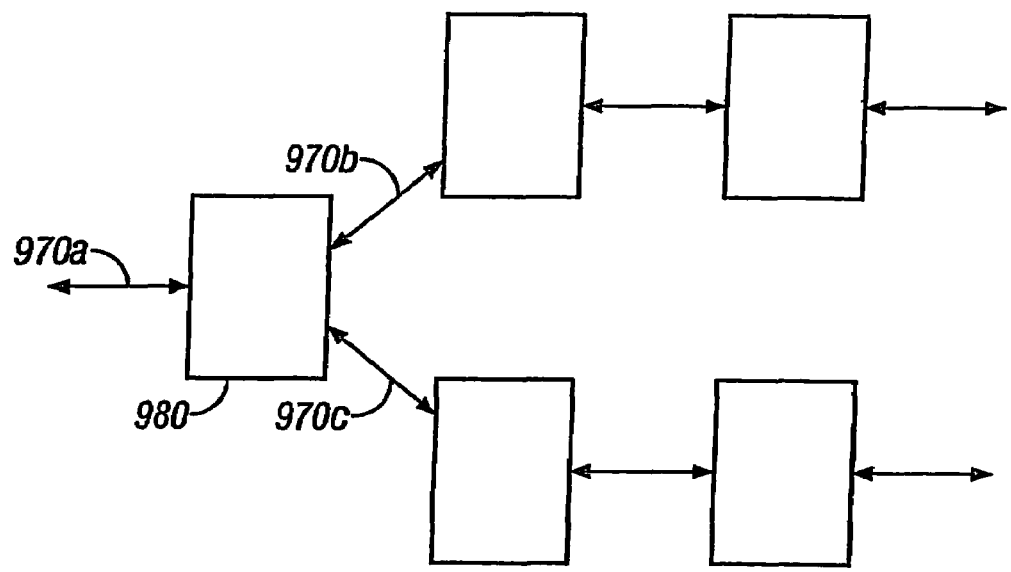

FIG. 8B illustrates another approach utilized to expand the memory capacity of a memory system in accordance to yet another embodiment Here, a plurality of buffered modules 950a–950d are "daisy chained" via a plurality of point-to-point links 960a–960d to increase the overall memory capacity. Connection points of each point-to-point link are connected to two adjacent buffered modules. Each of buffered modules 950a–950c transceive signals between adjacent point-to-point links 960a–960d. Point-to-point link 960a may be coupled to a controller or another buffered module. Additional point-to-point links may be coupled to a buffer device in a tree configuration approach. For example, three point-to-point links 970a–970c each having a single end connected to one buffer device may be employed as shown in FIG. 8C.

While this invention has been described in conjunction with what is presently considered the most practical embodiments, the invention is not limited to the disclosed embodiments. In the contrary, the embodiments disclosed cover various modifications that are within the scope of the invention as set forth in the following claims.

What is claimed is:

1. A memory module comprising:
 a connector interface;
 a plurality of memory devices including a first memory device and a second memory device;
 an integrated circuit buffer device, coupled to the connector interface, to receive control information via the connector interface;
 a first plurality of signal lines coupled to the first memory device and the integrated circuit buffer device, the first plurality of signal lines to carry a first address from the integrated circuit buffer device to the first memory device;
 a second plurality of signal lines coupled to the first memory device and the integrated circuit buffer device, the second plurality of signal lines to carry at least a first control signal from the integrated circuit buffer device to the first memory device, the at least a first control signal to specify a read operation by the first memory device such that the first memory device provides first data, accessed from a memory location in the first memory device based on the first address, to the integrated circuit buffer device, the at least a first control signal corresponding to the control information;
 a first signal line coupled to the first memory device and the integrated circuit buffer device, the first signal line to carry a first signal from the integrated circuit buffer device to the first memory device, the first signal to synchronize communication of the first control signal from the integrated circuit buffer device to the first memory device;
 a third plurality of signal lines coupled to the second memory device and the integrated circuit buffer device, the third plurality of signal lines to carry a second address from the integrated circuit device to the second memory device;
 a fourth plurality of signal lines coupled to the second memory device and the integrated circuit buffer device, the fourth plurality of signal lines to carry at least a second control signal from the integrated circuit buffer device to the second memory device, the at least a second control signal to specify a read operation by the second memory device such that the second memory device provides second data, accessed from a memory location in the second memory device based on the second address, to the integrated circuit buffer device, the at least a second control signal corresponding to the control information;
 a second signal line coupled to the second memory device and the integrated circuit buffer device, the second signal line to carry a second signal from the integrated circuit buffer device to the second memory device, the second signal to synchronize communication of the second control signal from the integrated circuit buffer device to the second memory device; and
 a transmitter circuit, disposed on the integrated circuit buffer device, the transmitter circuit coupled to the connector interface to transmit the first data and the second data.

2. The memory module of claim 1, wherein the plurality of memory devices further includes a third memory device and a fourth memory device, wherein:
 the third memory device is coupled to the first plurality of signal lines, the second plurality of signal lines and the first signal line; and
 the fourth memory device is coupled to the third plurality of signal lines, the fourth plurality of signal lines and the second signal line.

3. The memory module of claim 1, further including:
 a third signal line coupled to the first memory device and the integrated circuit buffer device, the third signal line to carry a signal that travels alongside the first data as the first data travels from the first memory device to the integrated circuit buffer device; and
 a fourth signal line coupled to the second memory device and the integrated circuit buffer device, the fourth signal line to carry a signal that travels alongside the second data as the second data travels from the second memory device to the integrated circuit buffer device.

4. The memory module of claim 1, wherein the integrated circuit buffer device further includes:
 a receiver circuit to receive the control information; and
 termination coupled to the receiver circuit.

5. The memory module of claim 4, wherein the receiver circuit is to receive the control information and address information in a packet format.

6. The memory module of claim 1, further including:
 a first plurality of termination elements disposed on the memory module, each termination element of the first plurality of termination elements coupled to a respective signal line of the first plurality of signal lines;
 a second plurality of termination elements disposed on the memory module, each termination element of the second plurality of termination elements coupled to a respective signal line of the second plurality of signal lines;
 a third plurality of termination elements disposed on the memory module, each termination element of the third plurality of termination elements coupled to a respective signal line of the third plurality of signal lines;
 a fourth plurality of termination elements disposed on the memory module, each termination element of the fourth plurality of termination elements coupled to a respective signal line of the fourth plurality of signal lines;
 a first termination element disposed on the memory module, the first termination element coupled to the first signal line; and
 a second termination element disposed on the memory module, the second termination element coupled to the second signal line.

7. The memory module of claim 1, wherein each memory device of the plurality of memory devices is a double data rate memory device.

8. The memory module of claim 1, wherein each of the first signal and the second signal is a clock signal.

9. A memory module comprising:
a connector interface disposed along an edge of the memory module;
an integrated circuit buffer device coupled to the connector interface, the integrated circuit buffer device to receive control information;
a first memory device;
a second memory device;
a first plurality of signal lines coupled to the first memory device and the integrated circuit buffer device, the first plurality of signal lines to carry at least a first control signal from the integrated circuit buffer device to the first memory device such that the first memory device provides first data in response to the at least a first control signal, the at least a first control signal corresponding to the control information;
a first signal line coupled to the first memory device and the integrated circuit buffer device, the first signal line to carry a signal that travels alongside the first data as the first data travels from the first memory device to the integrated circuit buffer device;
a second plurality of signal lines coupled to the second memory device and the integrated circuit buffer device, the second plurality of signal lines to carry at least a second control signal from the integrated circuit buffer device to the second memory device such that the second memory device provides second data in response to the at least a second control signal, the at least a second control signal corresponding to the control information;
a second signal line coupled to the second memory device and the integrated circuit buffer device, the second signal line to carry a signal that travels alongside the second data as the second data travels from the second memory device to the integrated circuit buffer device; and
a transmitter circuit disposed on the integrated circuit buffer device, the transmitter circuit to output the first data and the second data to the connector interface.

10. The memory module of claim 9, wherein the integrated circuit buffer device includes:
a receiver circuit to receive the control information; and
termination coupled to the receiver circuit.

11. The memory module of claim 9, further including:
a third memory device coupled to the first plurality of signal lines and the first signal line; and
a fourth memory device coupled to the second plurality of signal lines and the second signal line.

12. The memory module of claim 9, further including:
a third plurality of signal lines coupled to the first memory device and the integrated circuit buffer device, the third plurality of signal lines to carry a first address to specify a memory address of the first data;
a first plurality of termination elements, each termination element of the first plurality of termination elements coupled to a respective signal line of the third plurality of signal lines;
a fourth plurality of signal lines coupled to the second memory device and the integrated circuit buffer device, the fourth plurality of signal lines to carry a second address to specify a memory address of the second data; and a second plurality of termination elements, each termination element of the second plurality of termination elements coupled a respective signal line of the fourth plurality of signal lines.

13. The memory module of claim 9, wherein the control information received by the integrated buffer device is received with address information in a packet format.

14. The memory module of claim 9, wherein each of the first signal and the second signal is a clock signal.

15. The memory module of claim 9, wherein:
the first plurality of signal line further carry a first address from the integrated circuit buffer device to the first memory device, the first address to specify a memory address of the first data, wherein the first address and the first control signal is included in a first packet; and
the second plurality of signal line further carry a second address from the integrated circuit buffer device to the second memory device, the second address to specify a memory address of the second data, wherein the second address and the second control signal is included in a second packet.

16. A method of operation in a memory module that includes a memory module interface, an integrated circuit buffer device, a first memory device, and a second memory device, the method comprising:
receiving, via the memory module interface, first control information at the integrated circuit buffer device;
providing, by the integrated circuit buffer device, a first control signal, corresponding to the first control information, to the first memory device, the first control signal specifying a read operation in the first memory device such that the first memory device provides first data to the integrated circuit buffer device;
providing, by the integrated circuit buffer device, a first signal to the first memory device, the first signal to synchronize communication of the first control signal to the first memory device;
receiving, by the integrated circuit buffer device, the first data from the first memory device;
providing, by the integrated circuit buffer device, a second control signal, corresponding to the first control information, to the second memory device, the second control signal specifying a read operation in the second memory device such that the second memory device provides second data to the integrated circuit buffer device;
providing, by the integrated circuit buffer device, a second signal to the second memory device, the second signal to synchronize communication of the second control signal to the memory device;
receiving, by the integrated circuit buffer device, the second data from the second memory device; and
transmitting, by the integrated circuit buffer device via the memory module interface, the first data and the second data.

17. The method of claim 16, further including receiving, by the integrated circuit buffer device, address information via the memory module interface, wherein the first control information and the address information is received in a packet format.

18. The method of claim 16, further comprising:
receiving, by the integrated circuit buffer device, a signal that travels alongside the first data as the first data travels from the first memory device to the integrated circuit buffer device;

receiving, by the integrated circuit buffer device, the first data synchronously with respect to the signal that travels alongside the first data;

receiving, by the integrated circuit buffer device, a signal that travels alongside the second data as the second data travels from the second memory device to the integrated circuit buffer device; and receiving, by the integrated circuit buffer device, the second data synchronously with respect to the signal that travels alongside the second data.

19. The method of claim 16, further comprising:
receiving, by the integrated circuit buffer device, second control information via the memory module interface;
forwarding, by the integrated circuit buffer device, the second control information to a buffered module having a buffer device and a plurality of memory devices; and
receiving, by the integrated circuit buffer device, third data from the buffer device of the buffered module, the third data provided by the plurality of memory devices to the buffer device in response to the second control information.

20. The method of claim 16, further comprising:
providing, by the integrated circuit buffer device, a first address to the first memory device, the first address specifying a memory location in the first memory device for the read operation in the first memory device; and
providing, by the integrated circuit buffer device, a second address to the second memory device, the second address specifying a memory location in the second memory device for the read operation in the second memory device.

21. The method of claim 20, wherein the first address and the first control signal are provided in a first packet, and the second address and the second control signal are provided in a second packet.

22. The method of claim 16, wherein each of the first signal and the second signal is a clock signal.

23. A method of operation of a memory module including an integrated circuit buffer device, a first memory device and a second memory device, the method comprising:
receiving, by the integrated circuit buffer device, first control information via a module interface;
transmitting, by the integrated circuit buffer device, at least a first control signal to the first memory device, the at least a first control signal corresponding to the first control information, wherein the at least a first control signal specifies a read operation in the first memory device such that the first memory device provides first data to the integrated circuit buffer device;
receiving, by the integrated circuit buffer device, a first signal that travels from the first memory device to the integrated circuit buffer device alongside the first data;
receiving, by the integrated circuit buffer device, the first data;
transmitting, by the integrated circuit buffer device, at least a second control signal to the second memory device, the at least a second control signal corresponding to the first control information, wherein the at least a second control signal specifies a read operation in the second memory device such that the second memory device provides second data to the integrated circuit buffer device;

receiving, by the integrated circuit buffer device, a second signal that travels from the second memory device to the integrated circuit buffer device alongside the second data;

receiving, by the integrated circuit buffer device, the second data; and transmitting, by the integrated circuit buffer device, the first data and the second data via the module interface.

24. The method of claim 23, further comprising:
receiving, by the integrated circuit buffer device, second control information via the module interface;
forwarding the second control information, by the integrated circuit buffer device, to a buffered module having a buffer device and a plurality of memory devices; and
receiving, by the integrated circuit buffer device, third data from the buffer device of the buffered module, the third data provided by the plurality of memory devices in the buffered module in response to the second control information.

25. The method of claim 23, further comprising:
receiving, at the integrated circuit buffer device, a first address and a second address via the module interface;
transmitting, by the integrated circuit buffer device, the first address to the first memory device; and
transmitting, by the integrated circuit buffer device, the second address to the second memory device.

26. A memory module comprising:
a connector interface;
an integrated circuit buffer device, coupled to the connector interface, the integrated circuit buffer device to receive, in a packet format, control information and address information via the connector interface;
a first plurality of signal lines coupled to a first memory device and the integrated circuit buffer device, the first plurality of signal lines to carry a first address from the integrated circuit buffer device to the first memory device;
a first plurality of termination elements, each termination element of the first plurality of termination elements coupled to a respective signal line of the first plurality of signal lines;
a second plurality of signal lines coupled to the first memory device and the integrated circuit buffer device, the second plurality of signal lines to carry at least a first control signal from the integrated circuit buffer device to the first memory device, the at least a first control signal corresponding to the control information;
a third plurality of signal lines coupled to a second memory device and the integrated circuit buffer device, the third plurality of signal lines to carry a second address from the integrated circuit buffer device to the second memory device;
a second plurality of termination elements, each termination element of the second plurality of termination elements coupled to a respective signal line of the third plurality of signal lines;
a fourth plurality of signal lines coupled to the second memory device and the integrated circuit buffer device, the fourth plurality of signal lines to carry a second control signal from the integrated circuit buffer device to the second memory device, the second control signal corresponding to the control information; and
a transmitter circuit, disposed on the integrated circuit buffer device, to transmit first data received from the first memory device and second data received from the second memory device.

27. The memory module of claim 26, further comprising:
a first signal line coupled to the first memory device and the integrated circuit buffer device, the first signal line to carry a signal that travels alongside the first data as the first data travels from the first memory device to the integrated circuit buffer device; and
a second signal line coupled to the second memory device and the integrated circuit buffer device, the second signal line to carry a signal that travels alongside the second data as the second data travels from the second memory device to the integrated circuit buffer device.

28. The memory module of claim 27, wherein each of the first signal and the second signal is a clock signal.

29. A memory module comprising:
an integrated circuit buffer device,
a first plurality of memory devices;
a first plurality of signal lines coupled to the first plurality of memory devices and the integrated circuit buffer device, the first plurality of signal lines to carry a first address from the integrated circuit buffer device to the first plurality of memory devices;
a first plurality of termination elements disposed on the memory module, each termination element of the first plurality of termination elements coupled to a respective signal line of the first plurality of signal lines;
a second plurality of signal lines coupled to the first plurality of memory devices and the integrated circuit buffer device, the second plurality of signal lines to carry at least a first control signal from the integrated circuit buffer device to the first plurality of memory devices;
a second plurality of termination elements disposed on the memory module, wherein each termination element of the second plurality of termination elements is coupled to a respective signal line of the second plurality of signal lines;
a first signal line coupled to the first plurality of memory devices and the integrated circuit buffer device, the first signal line to carry a first clock signal from the integrated circuit buffer device to the first plurality of memory devices, the first clock signal to synchronize communication of the first control signal from the integrated circuit buffer device to the first plurality of memory devices; and
a first termination element coupled to the first signal line.

30. The memory module of claim 29, further comprising:
a second plurality of memory devices;
a third plurality of signal lines coupled to the second plurality of memory devices and the integrated circuit buffer device, the third plurality of signal lines to carry a second address from the integrated circuit buffer device to the second plurality of memory devices;
a third plurality of termination elements disposed on the memory module, wherein each termination element of the third plurality of termination elements is coupled to a respective signal line of the third plurality of signal lines;
a fourth plurality of signal lines coupled to the second plurality of memory devices and the integrated circuit buffer device, the fourth plurality of signal lines to carry at least a second control signal from the integrated circuit buffer device to the second plurality of memory devices;
a fourth plurality of termination elements disposed on the memory module, wherein each termination element of the fourth plurality of termination elements is coupled to a respective signal line of the fourth plurality of signal lines;
a second signal line coupled to the second plurality of memory devices and the integrated circuit buffer device, the second signal line to carry a second clock signal from the integrated circuit buffer device to the second plurality of memory devices, the second clock signal to synchronize communication of the second control signal from the integrated circuit buffer device to the second plurality of memory devices; and
a second termination element coupled to the second signal line.

31. The memory module of claim 30, wherein each memory device of the first and second pluralities of memory devices is a double data rate memory device.

32. The memory module of claim 29, further comprising a connector interface disposed on an edge of the memory module and coupled to the integrated circuit buffer device, the integrated circuit buffer device to receive, in a packet format, control information and address information via the connector interface.

* * * * *